(12) United States Patent
Xiao et al.

(10) Patent No.: US 11,594,184 B2
(45) Date of Patent: Feb. 28, 2023

(54) DISPLAY SUBSTRATE AND MANUFACTURING METHOD THEREOF, DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Yunsheng Xiao, Beijing (CN); Haigang Qing, Beijing (CN); Xiangdan Dong, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 20 days.

(21) Appl. No.: 17/280,598

(22) PCT Filed: Jun. 19, 2020

(86) PCT No.: PCT/CN2020/097080
§ 371 (c)(1),
(2) Date: Mar. 26, 2021

(87) PCT Pub. No.: WO2021/253392
PCT Pub. Date: Dec. 23, 2021

(65) Prior Publication Data
US 2022/0199029 A1 Jun. 23, 2022

(51) Int. Cl.
*G09G 3/3266* (2016.01)
*G11C 19/28* (2006.01)
(Continued)

(52) U.S. Cl.
CPC .......... *G09G 3/3266* (2013.01); *G11C 19/28* (2013.01); *H01L 27/3276* (2013.01);
(Continued)

(58) Field of Classification Search
CPC ......... G09G 3/3266; G09G 2300/0426; G09G 2300/0852; G09G 2310/0286;
(Continued)

(56) References Cited

U.S. PATENT DOCUMENTS

2014/0055444 A1\* 2/2014 Jang ..................... G09G 3/3266
345/213
2015/0279480 A1 10/2015 Murakami et al.
(Continued)

FOREIGN PATENT DOCUMENTS

CN 110095889 A 8/2019
CN 110767665 A 2/2020
(Continued)

OTHER PUBLICATIONS

International Search Report of PCT/CN2020/097080 in Chinese, dated Mar. 24, 2021.
(Continued)

*Primary Examiner* — Adam J Snyder
(74) *Attorney, Agent, or Firm* — Collard & Roe, P.C.

(57) ABSTRACT

A display substrate and a manufacturing method, and a display device are provided. The display substrate includes a base substrate including a display region and a periphery region; and a shift register unit, a first power line and a second power line; an orthographic projection of the first power line on the base substrate is on a side of an orthographic projection of the shift register unit on the base substrate closer to the display region, an orthographic projection of the second power line on the base substrate is on a side of the orthographic projection of the shift register unit on the base substrate away from the display region, and the orthographic projection of the shift register unit on the base substrate is between the orthographic projection of the first
(Continued)

power line on the base substrate and the orthographic projection of the second power line on the base substrate.

18 Claims, 9 Drawing Sheets

(51) Int. Cl.
    *H01L 27/32* (2006.01)
    *H01L 29/786* (2006.01)
    *H01L 29/66* (2006.01)
    *H01L 27/12* (2006.01)

(52) U.S. Cl.
    CPC .............. *G09G 2300/0408* (2013.01); *G09G 2300/0426* (2013.01); *G09G 2300/0852* (2013.01); *G09G 2310/0286* (2013.01); *H01L 27/124* (2013.01); *H01L 29/66757* (2013.01); *H01L 29/78666* (2013.01)

(58) Field of Classification Search
    CPC ............ G09G 2300/0408; G11C 19/28; H01L 27/3276; H01L 27/124; H01L 29/66757; H01L 29/78666
    See application file for complete search history.

(56) References Cited

U.S. PATENT DOCUMENTS

| | | | |
|---|---|---|---|
| 2017/0116920 A1* | 4/2017 | Kwon | G09G 3/3266 |
| 2017/0186362 A1* | 6/2017 | Shim | G09G 3/3266 |
| 2017/0249905 A1* | 8/2017 | Kim | G09G 3/3266 |
| 2017/0345366 A1* | 11/2017 | Jang | G09G 3/3266 |
| 2019/0295450 A1* | 9/2019 | Xi | G09G 3/20 |
| 2019/0304374 A1* | 10/2019 | Wang | G09G 3/3266 |
| 2019/0318693 A1* | 10/2019 | Jung | G09G 3/3266 |
| 2020/0035162 A1* | 1/2020 | In | G09G 3/3266 |

FOREIGN PATENT DOCUMENTS

| | | |
|---|---|---|
| CN | 111210776 A | 5/2020 |
| CN | 111243650 A | 6/2020 |

OTHER PUBLICATIONS

Notice of Transmittal of the International Search Report of PCT/CN2020/097080 in Chinese, dated Mar. 24, 2021.
Written Opinion of the International Searching Authority of PCT/CN2020/097080 in Chinese, mailed Mar. 24, 2021.
International Search Report of PCT/CN2020/097080, dated Mar. 24, 2021 in English.

* cited by examiner

DISPLAY SUBSTRATE AND MANUFACTURING METHOD THEREOF, DISPLAY DEVICE

CROSS REFERENCE TO RELATED APPLICATIONS

This application is the National Stage of PCT/CN2020/097080 filed on Jun. 19, 2020, the disclosure of which is incorporated by reference.

TECHNICAL FIELD

Embodiments of the present disclosure relate to a display substrate and a manufacturing method thereof, and a display device.

BACKGROUND

In the field of display technology, the pixel array of, for example, a liquid crystal display panel or an organic light-emitting diode (OLED) display panel usually includes gate lines in a plurality of rows, and data lines that are in a plurality of columns and intersected with the gate lines. The gate lines can be driven by an integrated drive circuit which are bonded on a display panel. In recent years, with the continuous improvement in the manufacturing process of amorphous silicon thin film transistor or oxide thin film transistor, a drive circuit for driving gate lines can also be directly integrated on the thin film transistor array substrate to form the gate driver on array (GOA) for driving the gate lines. For example, a GOA including a plurality of shift register units that are cascaded may be adopted to provide voltage signals (scan signals) of turn-on and turn-off states to the gate lines, in the plurality of rows, of the pixel array, to control gate lines in the plurality of rows to be opened in sequence; meanwhile, data signals are provided to the pixel units in corresponding rows of the pixel array by data lines, so as to form gray scale voltages required by gray scales of the display image at each pixel unit, such that an image is display.

SUMMARY

At least one embodiment of the present disclosure provides a display substrate, comprising: a base substrate, comprising a display region and a periphery region on at least one side of the display region; and a shift register unit, a first power line and a second power line, which are on the periphery region of the base substrate; the first power line is configured to provide a first voltage to the shift register unit, and the second power line is configured to provide a second voltage to the shift register unit; the shift register unit comprises an input circuit, a first node control circuit, a second node control circuit, a third node control circuit, a fourth node control circuit, and an output control circuit; the input circuit is configured to input an input signal to a first node in response to a first clock signal; the second node control circuit is connected to the first power line, and is configured to input the first voltage provided by the first power line or the first clock signal to a second node, under control of the first clock signal and an electrical level of the first node, so as to control an electrical level of the second node; the first node control circuit is connected to the second power line, and is configured to input the second voltage provided by the second power line to the first node under control of a second clock signal and the electrical level of the second node, so as to perform noise reduction on the first node; the third node control circuit is configured to control an electrical level of the third node in response to the electrical level of the second node; the fourth node control circuit is configured to input the electrical level of the third node to the fourth node under control of the second clock signal; the output control circuit is connected to the second power line and an output terminal, and is configured to output the second voltage which is provided by the second power line and serves as an output signal, to the output terminal under control of an electrical level of the fourth node; and an orthographic projection of the first power line on the base substrate is on a side of an orthographic projection of the shift register unit on the base substrate closer to the display region, an orthographic projection of the second power line on the base substrate is on a side of the orthographic projection of the shift register unit on the base substrate away from the display region, and the orthographic projection of the shift register unit on the base substrate is between the orthographic projection of the first power line on the base substrate and the orthographic projection of the second power line on the base substrate.

For example, the display substrate provided by at least one embodiment of the present disclosure, further comprises: a first clock signal line and a second clock signal line, which are configured to respectively provide the first clock signal or the second clock signal to the shift register unit, the first power line, the second power line, the first clock signal line and the second clock signal line are on the base substrate and extend along a first direction; and the orthographic projection of the second power line on the base substrate is between an orthographic projection of the first clock signal line and the second clock signal line on the base substrate and the orthographic projection of the shift register unit on the base substrate.

For example, in the display substrate provided by at least one embodiment of the present disclosure, the second node control circuit comprises a first control transistor and a second control transistor; an active layer of the first control transistor and an active layer of the second control transistor extend along the first direction; and an orthographic projection of the active layer of the first control transistor on the base substrate is on a side of an orthographic projection of the active layer of the second control transistor on the base substrate away from the display region.

For example, the display substrate provided by at least one embodiment of the present disclosure, further comprises: a first transfer-connection electrode; the first transfer-connection electrode comprises a first portion extending along a second direction which is different from the first direction, and a second portion extending along the first direction, and the second portion and the first portion are integratedly formed; an orthographic projection of the second portion of the first transfer-connection electrode on the base substrate and the orthographic projection of the active layer of the first control transistor on the base substrate are side by side along the second direction, and the orthographic projection of the second portion of the first transfer-connection electrode on the base substrate is at an imaginary line, along the first direction, of the orthographic projection of the active layer of the second control transistor on the base substrate; and a first electrode of the first control transistor is connected to the first portion of the first transfer-connection electrode, and a first electrode of the second control transistor is connected to the second portion of the first transfer-connection electrode.

For example, in the display substrate provided by at least one embodiment of the present disclosure, the input circuit comprises an input transistor, an active layer of the input transistor extends along the first direction; an orthographic projection of the active layer of the input transistor on the base substrate is on a side of the orthographic projection of the active layer of the first control transistor on the base substrate away from the display region; and the orthographic projection of the active layer of the input transistor on the base substrate and the orthographic projection of the active layer of the second control transistor on the base substrate are side by side along the second direction.

For example, the display substrate provided by at least one embodiment of the present disclosure, further comprises: a first connection wire extending along the second direction; the first connection wire comprises a first portion and a second portion; the first portion of the first connection wire is connected to a gate electrode of the second control transistor and a gate electrode of the input transistor, and the first portion of the first connection wire, as well as the gate electrode of the second control transistor and the gate electrode of the input transistor are integratedly formed; the second portion of the first connection wire and the gate electrode of the input transistor are connected and integratedly formed; and the second portion of the first connection wire is further connected to the first clock signal line in a layer different from a layer where the second portion of the first connection wire is located.

For example, the display substrate provided by at least one embodiment of the present disclosure, further comprises: a second transfer-connection electrode; a second electrode of the first control transistor is connected to the second transfer-connection electrode; and the first portion of the first connection wire is connected to the second transfer-connection electrode through a via-hole running through an insulation layer, so as to connect the second electrode of the first control transistor to the gate electrode of the second control transistor and the gate electrode of the input transistor, which are in a layer different from a layer where the second electrode of the first control transistor is located.

For example, in the display substrate provided by at least one embodiment of the present disclosure, the first node control circuit comprises a first noise reduction transistor and a second noise reduction transistor; an active layer of the first noise reduction transistor and an active layer of the second noise reduction transistor are in a continuous first semiconductor layer, and the first semiconductor layer extends along the first direction; and a gate electrode of the first noise reduction transistor and a gate electrode of the second noise reduction transistor extend along the second direction, and are side by side along the first direction.

For example, in the display substrate provided by at least one embodiment of the present disclosure, the first semiconductor layer is at an imaginary line, extending along the first direction, of the active layer of the input transistor, and is on a side of the active layer of the first control transistor away from the active layer of the input transistor; and the gate electrode of the input transistor, the gate electrode of the first noise reduction transistor, and the gate electrode of the second noise reduction transistor are side by side along the first direction.

For example, the display substrate provided by at least one embodiment of the present disclosure, further comprises: a third transfer-connection electrode; the third transfer-connection electrode extends along the first direction; the first control transistor comprises a first gate electrode and a second gate electrode which are side by side along the first direction; the first gate electrode and a first end of the second gate electrode are connected to the third transfer-connection electrode through a via-hole running through an insulation layer; a first electrode of the input transistor is connected to a first end of the third transfer-connection electrode; and a first electrode of the first noise reduction transistor is connected to a second end of the third transfer-connection electrode.

For example, in the display substrate provided by at least one embodiment of the present disclosure, the second power line comprises a first protrusion portion protruding toward the display region in the second direction; the first protrusion portion overlaps, in a direction perpendicular to the base substrate, with and connects, through a via-hole, to the active layer, in the first semiconductor layer, of the second noise reduction transistor; and a first electrode of the second noise reduction transistor and the first protrusion portion are connected and integratedly formed, so as to enable the first electrode of the second noise reduction transistor to receive the second voltage.

For example, in the display substrate provided by at least one embodiment of the present disclosure, the third node control circuit comprises a third control transistor and a first capacitor; an active layer of the third control transistor extends along the first direction; the active layer of the third control transistor and the active layer of the second noise reduction transistor are side by side along the second direction; and an orthographic projection of the first capacitor on the base substrate is between an orthographic projection of the active layer of the second noise reduction transistor on the base substrate and an orthographic projection of the active layer of the third control transistor on the base substrate.

For example, in the display substrate provided by at least one embodiment of the present disclosure, the first transfer-connection electrode further comprises a third portion extending along the first direction, and the third portion of the first transfer-connection electrode and the first portion of the first transfer-connection electrode are integratedly formed; an orthographic projection of the third portion of the first transfer-connection electrode on the base substrate is at an imaginary line, along the first direction, of the orthographic projection of the active layer of the first control transistor on the base substrate; an end of the third portion of the first transfer-connection electrode is connected to the gate electrode of the second noise reduction transistor, a gate electrode of the third control transistor, and a first electrode of the first capacitor, which are in a layer different form a layer where the third portion of the first transfer-connection electrode is located; and the gate electrode of the second noise reduction transistor, the gate electrode of the third control transistor, and the first electrode of the first capacitor are integratedly formed.

For example, in the display substrate provided by at least one embodiment of the present disclosure, the shift register unit further comprises an output circuit; the output circuit is connected to the first power line and the output terminal, and is configured to reset the output terminal under control of the electrical level of the first node; the output circuit comprises an output transistor and a second capacitor; an orthographic projection of an active layer of the output transistor on the base substrate and an orthographic projection of the second capacitor on the base substrate are side by side along the second direction; the orthographic projection of the second capacitor on the base substrate is between an orthographic projection of the active layer of the first control transistor and the active layer of the second control transistor on the base substrate and the orthographic projection of the active layer of the output transistor on the base substrate; and the orthographic projection of the second capacitor on the base substrate is at an imaginary line, along the first direction, of the orthographic projection of the active layer of the third control transistor on the base substrate.

For example, in the display substrate provided by at least one embodiment of the present disclosure, a first electrode of the second capacitor is connected to second ends of the first gate electrode and the second gate electrode of the first control transistor, and the first electrode of the second capacitor and the second ends of the first gate electrode and the second gate electrode of the first control transistor are integratedly formed; the first electrode of the second capacitor is further connected to a gate electrode of the output transistor, and the first electrode of the second capacitor and the gate electrode of the output transistor are integratedly formed; and the gate electrode of the output transistor comprises a plurality of sub-gate electrodes which are side by side along the second direction.

For example, the display substrate provided by at least one embodiment of the present disclosure further comprises: a fourth transfer-connection electrode; an orthographic projection of the fourth transfer-connection electrode on the base substrate at least partially overlaps with the orthographic projection of the active layer of the output transistor on the base substrate; and a first end of the fourth transfer-connection electrode and a second electrode of the second control transistor are connected and integratedly formed, a second end of the fourth transfer-connection electrode and a first electrode of the output transistor are connected and integratedly formed, and a third end of the fourth transfer-connection electrode and the first power line are connected and integratedly formed.

For example, the display substrate provided by at least one embodiment of the present disclosure further comprises: a fifth transfer-connection electrode; the fifth transfer-connection electrode comprises a first portion extending along the first direction and a second portion extending along the second direction; a first electrode of the third control transistor and a second end of the first portion of the fifth transfer-connection electrode are connected and integratedly formed; the gate electrode of the first noise reduction transistor is connected to an end of the second portion of the fifth transfer-connection electrode and the second clock signal line, which are in a layer different form a layer where the gate electrode of the first noise reduction transistor is located; and a second electrode of the second capacitor is connected to a first end, which is in a layer different form a layer where the second electrode of the second capacitor is located, of the first portion of the fifth transfer-connection electrode.

For example, the display substrate provided by at least one embodiment of the present disclosure further comprises: a second connection wire extending along the second direction; the second connection wire and the gate electrode of the first noise reduction transistor are integratedly formed; and a first end of the second connection wire is connected to the end of the second portion of the fifth transfer-connection electrode through a via-hole running through an insulation layer, and a second end of the second connection wire is connected to the second clock signal line through a via-hole running through the insulation layer.

For example, in the display substrate provided by at least one embodiment of the present disclosure, the fourth node control circuit comprises a fourth control transistor, an active layer of the fourth control transistor extends along the first direction, and is on a side of the first semiconductor layer away from the active layer of the input transistor; a gate electrode of the fourth control transistor, as well as the gate electrode of the first noise reduction transistor, the gate electrode of the second noise reduction transistor, and the gate electrode of the input transistor are side by side along the first direction; and the gate electrode of the fourth control transistor is connected to the second clock signal line in a layer different from a layer where the gate electrode of the fourth control transistor is located.

For example, the display substrate provided by at least one embodiment of the present disclosure further comprises: a sixth transfer-connection electrode; the sixth transfer-connection electrode comprises a first portion extending along the second direction, a second portion extending along the first direction and a third portion extending along the second direction; the first portion and the third portion of the sixth transfer-connection electrode are parallel to each other, and the first portion and the third portion of the sixth transfer-connection electrode and the second portion of the sixth transfer-connection electrode are integratedly formed; an end of the first portion of the sixth transfer-connection electrode is connected to a first electrode of the fourth control transistor; the second portion of the sixth transfer-connection electrode is connected to a second electrode, which is in a layer different from a layer where the second portion of the sixth transfer-connection electrode is located, of the first capacitor; and an end of the third portion of the sixth transfer-connection electrode is connected to a second electrode of the third control transistor.

For example, the display substrate provided by at least one embodiment of the present disclosure further comprises: a third connection wire extending along the second direction; the third connection wire and the gate electrode of the fourth control transistor are integratedly formed; and an end of the third connection wire is connected to the second clock signal line through a via-hole running through an insulation layer.

For example, the display substrate provided by at least one embodiment of the present disclosure further comprises: a fourth node noise reduction circuit; the fourth node noise reduction circuit is connected to the first power line, the first node, and the fourth node, and is configured to perform noise reduction on the fourth node under control of the electrical level of the first node; the fourth node noise reduction circuit comprises a third noise reduction transistor; an active layer of the third noise reduction transistor extends along the second direction; and an orthographic projection of the active layer of the third noise reduction transistor on the base substrate and the orthographic projection of the second capacitor on the base substrate are side by side along the first direction, and the orthographic projection of the active layer of the third noise reduction transistor on the base substrate is on a side of the first capacitor closer to the display region, and is on a side of the orthographic projection of the active layer of the third control transistor on the base substrate away from the orthographic projection of the second capacitor on the base substrate.

For example, in the display substrate provided by at least one embodiment of the present disclosure, a gate electrode of the third noise reduction transistor extends along the first direction, and is connected to the first electrode of the second capacitor, the gate electrode of the output transistor, and the gate electrodes of the first control transistor; and the gate electrode of the third noise reduction transistor, as well as the first electrode of the second capacitor, the gate electrode of the output transistor, and the gate electrodes of the first control transistor are integratedly formed.

For example, in the display substrate provided by at least one embodiment of the present disclosure, the output control circuit comprises an output control transistor and a third capacitor; an active layer of the output control transistor and the active layer of the output transistor are in a continuous second semiconductor layer, and the second semiconductor layer extends along the first direction; an orthographic projection of the active layer of the output control transistor on the base substrate and an orthographic projection of the first capacitor and the third capacitor on the base substrate are side by side along the second direction; the third capacitor is on a side of the first capacitor away from the second capacitor; the orthographic projection of a second electrode of the third capacitor on the base substrate extends along the second direction; a first electrode of the third capacitor and a gate electrode of the output control transistor are connected and integratedly formed; the gate electrode of the output control transistor and the gate electrode of the output transistor are side by side along the first direction; and the gate electrode of the output control transistor comprises a plurality of sub-gate electrodes which are side by side in the first direction.

For example, in the display substrate provided by at least one embodiment of the present disclosure, the second power line further comprises a second protrusion portion protruding toward the display region in the second direction; the third capacitor overlaps the second power line and the second protrusion portion of the second power line in a direction perpendicular to the base substrate; and the second electrode of the third capacitor is connected to the second power line and the second protrusion portion of the second power line through a via-hole running through an insulation layer.

For example, the display substrate provided by at least one embodiment of the present disclosure further comprises: a seventh transfer-connection electrode, the seventh transfer-connection electrode comprises a first portion extending along the second direction and a second portion extending along the first direction; a first end of the first portion of the seventh transfer-connection electrode is connected to a second electrode of the fourth control transistor; an end of the second portion of the seventh transfer-connection electrode is connected to a first electrode of the third noise reduction transistor; and a second end of the first portion of the seventh transfer-connection electrode is connected to the first electrode of the third capacitor and the gate electrode of the output control transistor, which are in a layer different from a layer where the second end of the first portion of the seventh transfer-connection electrode is located.

For example, the display substrate provided by at least one embodiment of the present disclosure further comprises: an eighth transfer-connection electrode, the eighth transfer-connection electrode is connected to a second electrode of the third noise reduction transistor, a first electrode of the output control transistor, and the second electrode of the third capacitor.

For example, the display substrate provided by at least one embodiment of the present disclosure further comprises: a ninth transfer-connection electrode, the ninth transfer-connection electrode is connected to a second electrode of the output control transistor and a second electrode of an input transistor of a shift register unit at a next stage.

For example, the display substrate provided by at least one embodiment of the present disclosure further comprises: a tenth transfer-connection electrode and a fourth connection wire, the tenth transfer-connection electrode is connected to a second electrode of the output transistor, and is connected to the fourth connection wire in a layer different from a layer where the tenth transfer-connection electrode is located; the fourth connection wire is further connected to the ninth transfer-connection electrode which is in a layer different from a layer where the fourth connection wire is located; and the fourth connection wire is connected to at least one gate line, so as to output the output signal at the output terminal to a light-emitting control circuit of a pixel unit at the display region.

For example, the display substrate provided by at least one embodiment of the present disclosure further comprises: a trigger signal line, a plurality of shift register units, that are cascaded, form a gate drive circuit; the trigger signal line is configured to provide a trigger signal to the gate drive circuit; an orthographic projection of the trigger signal line on the base substrate is on a side of the orthographic projection of the first clock signal line and the second clock signal line on the base substrate away from the display region; and the trigger signal line is connected to a second electrode of an input transistor of a first stage of shift register unit in the gate drive circuit, so as to provide the trigger signal.

At least one embodiment of the disclosure also provides a display device, which comprises the display substrate provided by any one of embodiments of the present disclosure.

For example, in the display device provided by at least one embodiment of the present disclosure, the display device is an organic light-emitting diode display device.

For example, the display device provided by at least one embodiment of the present disclosure further comprises: pixel units which are arranged in an array; an output signal, which is output by the output control circuit of the shift register unit and serves as a light-emitting control signal, is output to the pixel units, so as to drive the pixel units to emit light.

For example, in the display device provided by at least one embodiment of the present disclosure, an output signal output by an output control circuit of one shift register unit is output to two corresponding rows of pixel units.

At least one embodiment of the disclosure also provides a manufacturing method of the display substrate provided by any one of embodiments of the present disclosure, comprises: providing the base substrate; forming the shift register unit, the first power line, the second power line, the first clock signal line and the second clock signal line on the base substrate; forming the shift register unit, comprises: sequentially forming a semiconductor layer, a first insulation layer, a first conductive layer, a second insulation layer, a second conductive layer, a third insulation layer, and a third conductive layer in a direction perpendicular to the base substrate; active layers of respective transistors are in the semiconductor layer, gate electrodes of the respective transistors, first electrodes of respective capacitors are in the first conductive layer, second electrodes of the respective capacitors are in the second conductive layer, and the first power line, the second power line, the first clock signal line, the second clock signal line and first electrodes and second electrodes of the respective transistors are in the third conductive layer; and through via-holes running through the first insulation layer, the second insulation layer or the third insulation layer, the transistors and the capacitors are connected, and are connected to the first power line, the second power line, the first clock signal line, and the second clock signal line.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
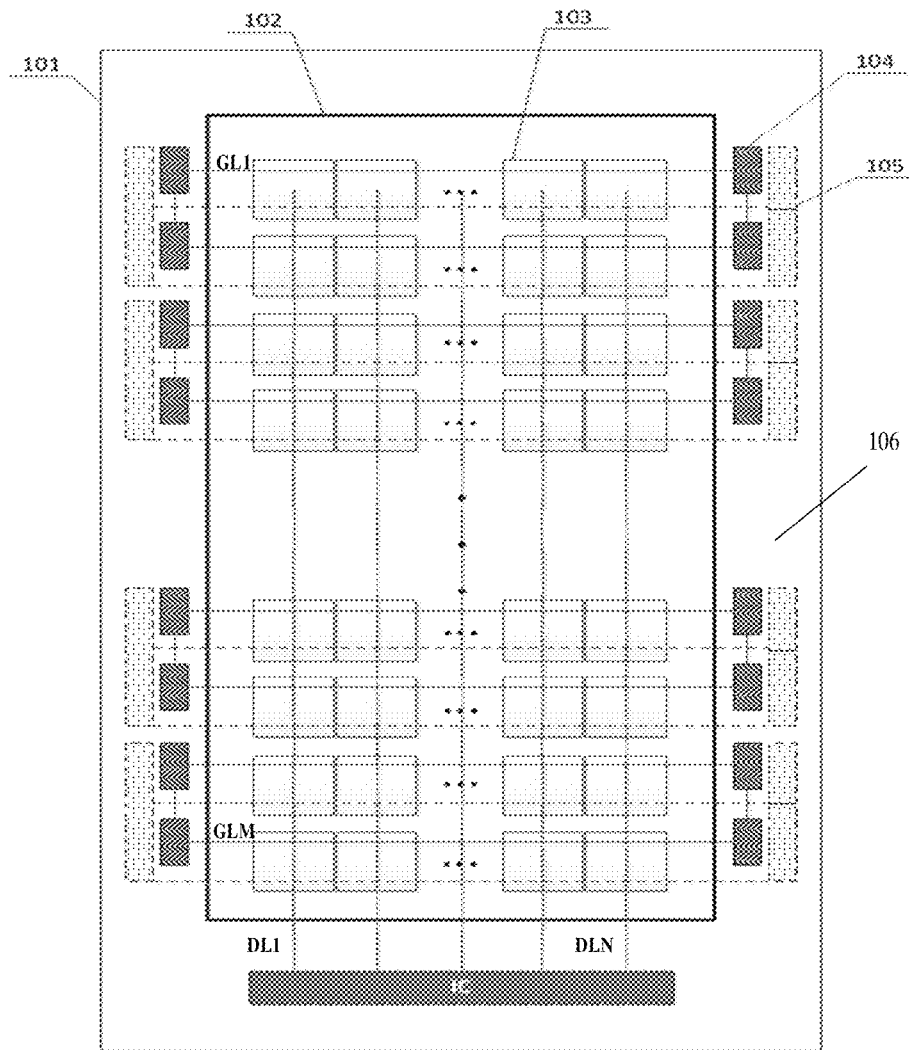
FIG. 1A is a schematic diagram of an overall circuit architecture of a display panel.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure will be explained by several specific examples. In order to keep the following description of embodiments of the present disclosure clear and concise, detailed descriptions of known functions and known components may be omitted. When any component of an embodiment of the present invention appears in more than one drawing, the component is denoted by the same reference numeral in each drawing.

FIG. 1A is a schematic diagram of an overall circuit architecture of a display panel. For example, as illustrated in FIG. 1A, 101 represents an overall outer frame line of the display panel; the display panel includes a display region (i.e., a pixel array region) 102 and a periphery region 106 at the periphery of the display region 102; and the display region includes pixel units 103 which are arranged in an array; the periphery region 106 includes scan drive shift register units 104, a plurality of scan drive shift register units 104 that are cascaded form a gate drive circuit (a gate GOA), and the gate drive circuit is configured to provide, for example, gate scan signals which are shifted row by row to the pixel units 103, which are arranged in an array, in the display region 102 of the display panel 101; the periphery region 106 further includes light-emitting-control shift register units 105, and a plurality of light-emitting-control shift register units 105 that are cascaded form a light-emitting-control drive circuit array (EM GOA), and the light-emitting-control drive circuit array is configured to provide, for example, light-emitting control signals which are shifted row by row to the pixel units 103, which are arranged in an array, in the display region 102 of the display panel 101, and the light-emitting-control drive circuit array is a gate drive circuit for outputting light-emitting control signals.

As illustrated in FIG. 1A, data lines DL1-DLN (N is an integer greater than 1), connected to a data drive chip IC, pass through the display region 102 longitudinally, so as to provide data signals to the pixel units 103 which are arranged in an array; gate lines GL1-GLM (M is an integer greater than 1), connected to the scan drive shift register unit 104 and the light-emitting-control shift register unit 105, pass through the display region 102 horizontally, so as to provide gate scan signals and light-emitting control signals to the pixel units 103 which are arranged in an array. For example, the pixel units 103 may include pixel circuits adopting circuit structures, such as 7T1C, 8T2C or 4T1C, in the art, and light-emitting elements, the pixel circuits are working under control of the data signals transmitted through the data lines, and the gate scan signals and the light-emitting control signals which are transmitted through the gate lines, so as to drive the light-emitting elements to emit light and realize operations, such as display. The light-emitting element, for example, may be an organic light-emitting diode (OLED) or a quantum dot light-emitting diode (QLED).

Figure 1B:
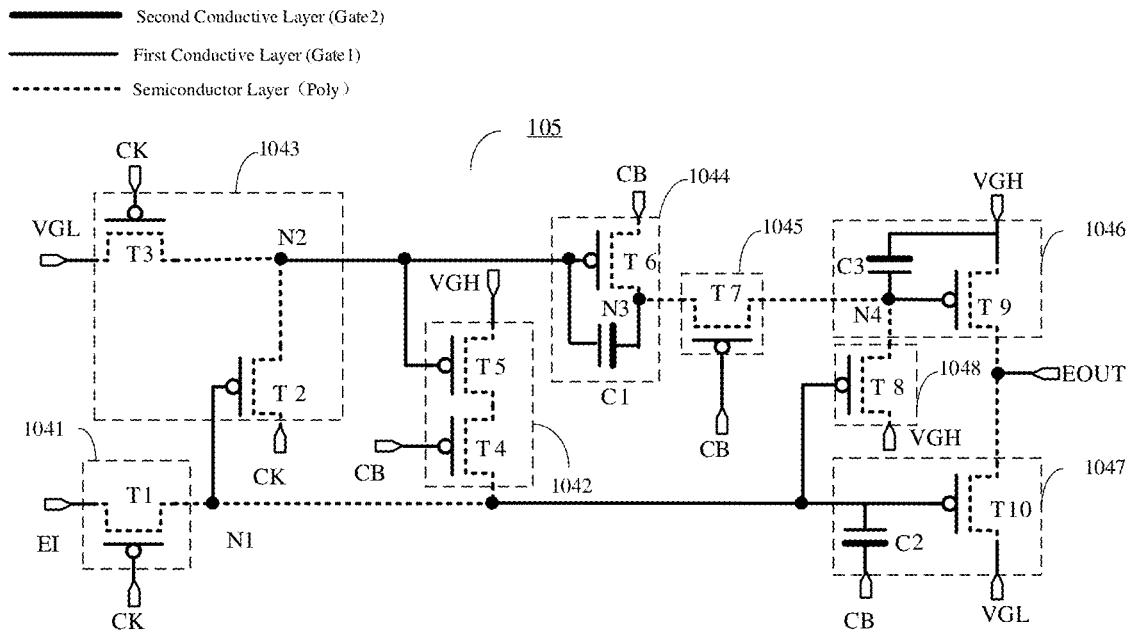
FIG. 1B is a circuit diagram of a light-emitting-control shift register unit.
Figure 1C:
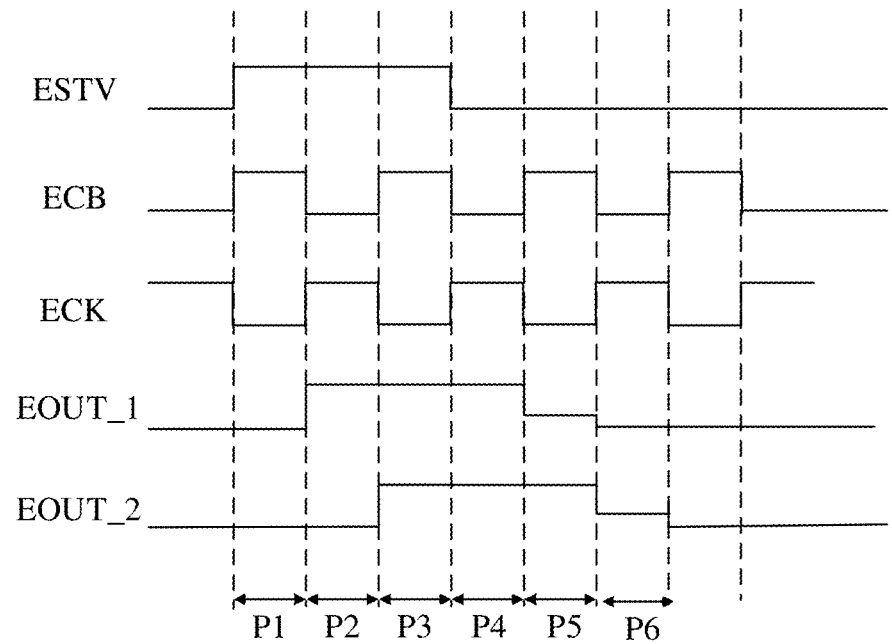
FIG. 1C is a signal timing diagram of the light-emitting-control shift register unit, in operation, as illustrated in FIG. 1B.

FIG. 1B is a circuit diagram of a light-emitting-control shift register unit; FIG. 1C is a signal timing diagram of the light-emitting-control shift register unit, in operation, as illustrated in FIG. 1B. In the following, the operation of the light-emitting-control shift register unit is briefly described with reference to FIG. 1B and FIG. 1C.

As illustrated in FIG. 1B, the light-emitting-control shift register unit 105 includes ten transistors (an input transistor T1, a first control transistor T2, a second control transistor T3, a first noise reduction transistor T4, a second noise reduction transistor T5, a third control transistor T6, a fourth control transistor T7, a third noise reduction transistor T8, an output control transistor T9, and an output transistor T10) and three capacitors (a first capacitor C1, a second capacitor C2, and a third capacitor C3). For example, in the case where a plurality of light-emitting-control shift register units 105 are cascaded, a second electrode of the input transistor T1 in the light-emitting-control shift register unit 105 at the first stage is connected to an input terminal EI; the input terminal EI is configured to connect to a trigger signal line ESTV to receive a trigger signal serving as an input signal; and the second electrode, of the input transistor T1 of the light-emitting-control shift register unit 105 at a stage among the stages other than the first stage, are electrically connected to an output terminal of the light-emitting-control shift register unit 105 at a previous stage, so as to receive an output signal, serving as the input signal, output by the output terminal EOUT of the light-emitting-control shift register unit 105 at the previous stage, so as to realize shift output and provide, for example, the light-emitting control signals which are shifted row by row to the pixel units 103, which are arranged in an array, in the display region 102 of the display panel 101.

In addition, as illustrated in FIG. 1B, the light-emitting-control shift register unit further includes a first clock signal terminal CK and a second clock signal terminal CB; ECK represents a first clock signal line, ECB represents a second clock signal line; for example, the first clock signal terminal CK is connected to the first clock signal line ECK or the second clock signal line ECB, to receive a first clock signal. For example, in the case where the first clock signal terminal CK is connected to the first clock signal line ECK, the first clock signal line ECK provides the first clock signal; in the case where the first clock signal terminal CK is connected to the second clock signal line ECB, the second clock signal line ECB provides the first clock signal; specific implementation can be set according to actual situation, and no limitation will be given in embodiments of the present disclosure in this respect. Similarly, the second clock signal terminal CB is connected to the second clock signal line ECB or the first clock signal line ECK to receive the second clock signal. In the following, descriptions are given by taking the case where the first clock signal terminal CK is connected to the first clock signal line ECK to receive the first clock signal and the second clock signal terminal CB is connected to the second clock signal line ECB to receive the second clock signal as an example, and no limitation will be given in embodiments of the present disclosure in this respect. For example, the first clock signal and the second clock signal may adopt pulse signals with duty cycle greater than 50%, and have, for example, a half-cycle difference; VGL represents a first power line, and a first voltage provided by the first power line; VGH represents a second power line, and a second voltage provided by the second power line; and the second voltage is greater than the first voltage; for example, the second voltage is a direct-current high level, and the first voltage is a direct-current low level; N1, N2, N3 and N4 respectively represent a first node, a second node, a third node and a fourth node in circuit diagrams.

As illustrated in FIG. 1B, a gate electrode of the input transistor T1 is connected to the first clock signal terminal CK (the first clock signal terminal CK is connected to the first clock signal line ECK) to receive the first clock signal; the second electrode of the input transistor T1 is connected to the input terminal EI; a first electrode of the input transistor T1 is connected to the first node N1. For example, in the case where the light-emitting-control shift register unit is the light-emitting-control shift register unit at the first stage, the input terminal EI is connected to a trigger signal line ESTV to receive the trigger signal; in the case where the light-emitting-control shift register unit is a light-emitting-control shift register unit at a stage among the stages other than the first stage, the input terminal EI is connected to an output terminal EOUT of a light-emitting-control shift register unit at an previous stage.

A gate electrode of the first control transistor T2 is connected to the first node N1, a first electrode of the first control transistor T2 is connected to the second node N2, and a second electrode of the first control transistor T2 is connected to the first clock signal terminal CK to receive the first clock signal.

A gate electrode of the second control transistor T3 is connected to the first clock signal terminal CK to receive the first clock signal, a first electrode of the second control transistor T3 is connected to the second node N2, and a second electrode of the second control transistor T3 is connected to the first power line VGL to receive the first voltage.

A gate electrode of the first noise reduction transistor T4 is connected to the second clock signal terminal CB (for example, the second clock signal terminal CB is connected to the second clock signal line ECB) to receive the second clock signal; a first electrode of the first noise reduction transistor T4 is connected to the first node N1; a second electrode of the first noise reduction transistor T4 is connected to a second electrode of the second noise reduction transistor T5.

A gate electrode of the second noise reduction transistor T5 is connected to the second node N2, and a first electrode of the second noise reduction transistor T5 is connected to the second power line VGH to receive the second voltage.

A gate electrode of the third control transistor T6 is connected to the second node N2; a first electrode of the third control transistor T6 is connected to the second clock signal terminal CB to receive the second clock signal; and a second electrode of the third control transistor T6 is connected to the third node N3.

A first electrode of the first capacitor C1 is connected to the second node N2, and a second electrode of the first capacitor C2 is connected to the third node N3.

A gate electrode of the fourth control transistor T7 is connected to the second clock signal terminal CB to receive the second clock signal, a first electrode of the fourth control transistor T7 is connected to the third node N3, and a second electrode of the fourth control transistor T7 is connected to the fourth node N4.

A gate electrode of the third noise reduction transistor T8 is connected to the first node N1, a first electrode of the third noise reduction transistor T8 is connected to the fourth node N4, and a second electrode of the third noise reduction transistor T8 is connected to the second power line VGH to receive the second voltage.

A gate electrode of the output control transistor T9 is connected to the fourth node N4, a first electrode of the output control transistor T9 is connected to the second power line VGH to receive the second voltage, and a second electrode of the output control transistor T9 is connected to the output terminal EOUT.

A first electrode of the third capacitor C3 is connected to the fourth node N4, and a second electrode of the third capacitor C3 is connected to the second power line VGH to receive the second voltage.

A gate electrode of the output transistor T10 is connected to the first node N1, a first electrode of the output transistor T10 is connected to the first power line VGL to receive the first voltage, and a second electrode of the output transistor T10 is connected to the output terminal EOUT.

A first electrode of the second capacitor C2 is connected to the first node N1, and a second electrode of the second capacitor C2 is connected to the second clock signal terminal CB to receive the second clock signal.

In description, the case where all the transistors of the light-emitting-control shift register unit 105 as illustrated in FIG. 1B are P-type transistors are taken as an example, that is, the transistors are turned on in the case where the gate electrodes of the transistors receive a low electric level (a turned-on electric level), and the transistors are turned off in the case where the gate electrodes of the transistors receive a high electric level (a turned-off electric level). In this case, the first electrodes of the transistors may be source electrodes, and the second electrodes of the transistors may be drain electrodes.

The configuration of the light-emitting-control shift register unit includes, but is not limited to, the configuration as illustrated in FIG. 1B; for example, the transistors of the light-emitting-control shift register unit 105 may also adopt N-type transistors, or adopt both P-type transistors and N-type transistors; as along as the terminal polarities of the selected type transistors are connected according to the terminal polarities of corresponding transistors in embodiments of the present disclosure.

It should be noted that, the transistors adopted in the light-emitting-control shift register unit can be thin-film transistors, field-effect transistors, or other switching devices with the same characteristics. Here, descriptions are given by taking the case where the transistors adopted in the light-emitting-control shift register unit are thin-film transistors as an example. For example, the active layers (channel regions) of the transistors are made of a semiconductor material, such as a polycrystalline silicon (such as a low-temperature polycrystalline silicon or a high-temperature polycrystalline silicon), an amorphous silicon, an indium gallium tin oxide (IGZO) and so on, and the gate electrodes, source electrodes and drain electrodes of the transistors are made of a metal material, such as aluminum or aluminum alloy. The source electrode and drain electrode of a transistor adopted here can be symmetrical in structure, so there is no difference in structure between the source electrode and the drain electrode. In embodiments of the present disclosure, in order to distinguish the two electrodes of the transistor except the gate electrode, it is directly described that one electrode is the first electrode and the other electrode is the second electrode. In addition, in embodiments of the present disclosure, the electrodes of a capacitor may be metal electrodes, or alternatively, one of the electrodes of a capacitor may adopt a semiconductor material (such as doped polysilicon).

FIG. 1C is a signal timing diagram of the light-emitting-control shift register unit 105, in operation, as illustrated in FIG. 1B. In the following, the operation of the light-emitting-control shift register unit is described in detail with reference to FIG. 1B and FIG. 1C. For example, the operation principle of the light-emitting-control shift register unit 105 at a first stage are described, and the operation principle of the light-emitting-control shift register unit 105 at other stages are similar, and no further descriptions will be given. As illustrated in FIG. 1C, the operation process of the light-emitting-control shift register unit 105 includes six phases, which are respectively a first phase P1, a second phase P2, a third phase P3, a fourth phase P4, a fifth phase P5, and a sixth phase P6, and FIG. 1C illustrates timing waveforms of signal in each phase.

In the first phase P1, as illustrated in FIG. 1C, the first clock signal line ECK provides a low electric level, and therefore, the first clock signal terminal CK connected to the first clock signal line ECK receives a first clock signal with a low electric level, the input transistor T1 and the second control transistor T3 are turned on, the input transistor T1 that is turned on enables the trigger signal ESTV with a high electric level to be transmitted to the first node N1, so as to change the electrical level of the first node N1 into a high electric level, and thus the first control transistor T2, the third noise reduction transistor T8, and the output transistor T10 are turned off. In addition, the second control transistor T3 that is turned on enables the first voltage with a low electric level to be transmitted to the second node N2, so as to change the electrical level of the second node N2 into a low electric level, and thus the second noise reduction transistor T5 and the third control transistor T6 are turned on. Because the second clock signal line ECB provides a high electric level, the second clock signal that is received by the second clock signal terminal CB connected to the second clock signal line ECB is a high electric level, and thus the first noise reduction transistor T4 and the fourth control transistor T7 are turned off. In addition, because the storage function of the third capacitor C3, the electrical level of the fourth node N4 can be kept being a high electric level, so as to enable the output control transistor T9 to be turned off. In the first phase P1, because the output control transistor T9 and the output transistor T10 are both turned off, the output signal output by the output terminal EOUT_1 of the light-emitting-control shift register unit 105 is kept being a low electric level that is previous existed.

In the second phase P2, as illustrated in FIG. 1C, the second clock signal line ECB provides a second clock signal with a low electric level to the second clock signal terminal CB, and thus the first noise reduction transistor T4 and the fourth control transistor T7 are turned on. Because the first clock signal line ECK provides a first clock signal with a high electric level to the first clock signal terminal, the input transistor T1 and the second control transistor T3 are turned off. Because the storage function of the first capacitor C1, the second node N2 can maintain the low electric level at the previous phase, and thus the second noise reduction transistor T5 and the third control transistor T6 are turned on. The second voltage VGH with a high electric level is transmitted to the first node N1 via the second noise reduction transistor T5 and the first noise reduction transistor T4 that are turned on, so as to enable the electrical level of the first node N1 to continue to be kept being the high electric level at the previous phase, and thus the first control transistor T2, the third noise reduction transistor T8, and the output transistor T10 are turned off. In addition, the second clock signal with a low electric level is transmitted to the fourth node N4 through the third control transistor T6 and the fourth control transistor T7 that are turned on, so as to change the electrical level of the fourth node N4 into a low electric level, and thus the output control transistor T9 are turned on, the output control transistor T9 that is turned on outputs the second voltage VGH with a high electric level, and thus the output signal output by an output terminal EOUT_1 of the light-emitting-control shift register unit 105 in the second phase P2 is a high electric level.

In the third phase P3, as illustrated in FIG. 1C, the first clock signal line ECK provides a first clock signal with a low electric level to the first clock signal terminal CK, and thus the input transistor T1 and the second control transistor T3 are turned on. The second clock signal line ECB provides a second clock signal with a high electric level to the second clock signal terminal CB, and thus the first noise reduction transistor T4 and the fourth control transistor T7 are turned off. Because the storage function of the third capacitor C3, the electrical level of the fourth node N4 can maintain the low electric level at the previous phase, so as to keep the output control transistor T9 being in a turn-on state; the output control transistor T9 that is turned on outputs the second voltage VGH with a high electric level, and thus it continues to keep the output signal output by the output terminal EOUT_1 of the light-emitting-control shift register unit 105 in the third phase P3 being a high electric level. Meanwhile, in this phase, the output terminal EOUT_2 of the light-emitting-control shift register unit 105 at the second stage outputs a high electric level (descriptions in detail may refer to the operation process in the second phase P2 of the light-emitting-control shift register unit 105 at the first stage).

In the fourth phase P4, as illustrated in FIG. 1C, the first clock signal line ECK provides the first clock signal with a high electric level to the first clock signal terminal CK, and thus the input transistor T1 and the second control transistor T3 are turned off. The second clock signal line ECB provides the second clock signal with a low electric level to the second clock signal terminal CB, and thus the first noise reduction transistor T4 and the fourth control transistor T7 are turned on. Because the storage function of the second capacitor C2, the electrical level of the first node N1 is kept being the high electric level at the previous phase, so as to turn off the first control transistor T2, the third noise reduction transistor T8 and the output transistor T10. Because the storage function of the first capacitor C1, it continues to keep the electrical level of the second node N2 being the low electric level at the previous phase, so as to turn on the second noise reduction transistor T5 and the third control transistor T6. In addition, the second clock signal with a low electric level is transmitted to the fourth node N4 through the third control transistor T6 and the fourth control transistor T7 that are turned on, so as to change the electrical level of the fourth node N4 into a low electric level, and thus the output control transistor T9 are turned on; the output control transistor T9 that is turned on outputs the second voltage VGH with a high electric level, and thus the output signal output by the output terminal EOUT_1 of the light-emitting-control shift register unit 105 in the fourth phase P4 is still to be a high electric level. Meanwhile, in this stage, the output terminal EOUT_2 of the light-emitting-control shift register unit 105 at the second stage outputs a high electric level (descriptions in detail may refer to the operation process in the above-mentioned third phase P3 of the light-emitting-control shift register unit 105 at the first stage).

In the fifth phase P5, as illustrated in FIG. 1C, the first clock signal line ECK provides a first clock signal with a low electric level to the first clock signal terminal CK, and thus the input transistor T1 and the second control transistor T3 are turned on. The second clock signal line ECB provides a second clock signal with a high electric level to the second clock signal terminal CB, and thus the first noise reduction transistor T4 and the fourth control transistor T7 are turned off. The input transistor T1 that is turned on enable the trigger signal ESTV with a low electric level to be transmitted to the first node N1, so as to change the electrical level of the first node N1 into a low electric level.

For example, in the fifth phase P5, the voltage of the first clock signal with a low electric level is −6V, the voltage of the low electric level of the trigger signal ESTV is −6V, the threshold voltage Vth of the input transistor T1 is −1.5V. Because the input transistor T1 is a P-type transistor, in order to turn on the input transistor T1, it is required the voltage Vgs between the gate electrode and the source electrode of the input transistor T1 to be smaller than the threshold voltage Vth of the input transistor T1, and therefore, in the case where the first node N1 is charged to enable the electric level of the first node N1 to be −4.5V, the input transistor T1 is turned off, and it is stopped to charge the first node N1 at this moment, that is, in this phase, the voltage of the low electric level at the first node N1 is −4.5V, and thus the first control transistor T2, the third noise reduction transistor T8, and the output transistor T10 are turned on. The first control transistor T2 that is turned on enable a first clock signal with a low electric level be transmitted to the second node N2, so as to further pull down the electrical level of the second node N2, and thus the electrical level of the second node N2 continues to be kept being the low electric level at the previous phase, so as to turn on the second noise reduction transistor T5 and the third control transistor T6. In addition, the third noise reduction transistor T8 that is turned on make the second voltage VGH with a high electric level be transmitted to the fourth node N4, so as to change the electrical level of the fourth node N4 into a high electric level, and thus the output control transistor T9 are turned off. The output transistor T10 that is turned on outputs the first voltage with a low electric level VGL (for example, −6V) in response to the low electric level (for example, −4.5V) at the first node N1; similarly, the threshold voltage Vth of the output transistor T10 is −1.5V, in order to turn on the output transistor T10, it is required the voltage Vgs between the gate electrode and the source electrode of the output transistor T10 to be smaller than the threshold voltage Vth of the output transistor T10, and therefore, in the case where the voltage output by the output terminal EOUT_1 is −3V, the output transistor T10 is turned off, that is, in this phase, the voltage of the low electric level at the output terminal EOUT_1 is −3V, and thus the output signal output, in the fifth phase P5, by the output terminal EOUT_1 of the light-emitting-control shift register unit 105 at the first stage is changed into a first low electric level (for example, −3V). Meanwhile, in this phase, the output terminal EOUT_2 of the light-emitting-control shift register unit 105 at the second stage outputs a high electric level (descriptions in detail may refer to the operation process, in the above-mentioned fourth phase P4, of the light-emitting-control shift register unit 105 at the first stage).

In the sixth phase P6, as illustrated in FIG. 1C, the first clock signal line ECK provides the first clock signal with a high electric level to the first clock signal terminal CK, the second clock signal line ECB provides the second clock signal with a low electric level to the second clock signal terminal CB, and thus the first noise reduction transistor T4 and the fourth control transistor T7 are turned on. Because the second clock signal is changed from a high electric level in the fifth phase P5 into a low electric level, the variation is, for example, Δt (for example, is greater than 6V); according to the bootstrap effect of the second capacitor C2, the electrical level of the first node N1 is changed from a low electric level (for example, −4.5V) in the fifth phase P5 into a low electric level (for example, −4.5V−Δt) with an even lower voltage value; and therefore, the first control transistor T2 and the output transistor T10 are turned on under control of the low electric level (for example, −4.5V−Δt) at the first node N1; according to the on-state characteristics of the output transistor T10 as described above, the first voltage with a low electric level VGL (for example, −6V) can be completely output to the output terminal EOUT_1. For example, in the sixth phase P6, the voltage output by the output terminal EOUT_1 is a second low electric level (for example, −6V). Meanwhile, in this phase, the output terminal EOUT_2 of the light-emitting-control shift register unit 105 at the second stage outputs a low electric level (for example, −3V, descriptions in detail may refer to the operation process, in the above-mentioned fifth phase P5, of the light-emitting-control shift register unit 105 at the first stage).

With the maturity of active matrix organic light-emitting diode (AMOLED) technology, more and more mobile terminals adopt an AMOLED as a display panel. At present, for the market, an AMOLED product with a narrow bezel has more competitive advantages and is favored by more consumers. In addition to the influence of packaging technology, the size of the bezel is also greatly limited by the overall size of an EM GOA (that is, light-emitting-control drive circuit array). The larger the size of the EM GOA, the larger the size of the left and right bezels of the panel; conversely, the smaller the size of the EM GOA, the smaller the size of the bezels of the panel.

Figure 1D:
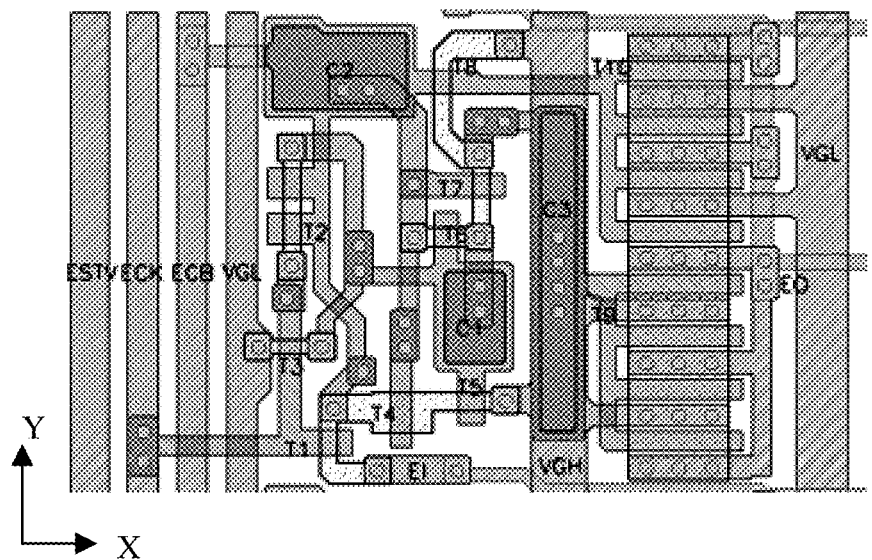
FIG. 1D is a schematical layout diagram of the light-emitting-control shift register unit, on the display substrate, as illustrated in FIG. 1B.

FIG. 1D is a schematical layout diagram of the light-emitting-control shift register unit, on the display substrate, as illustrated in FIG. 1B. For example, for the display substrate as illustrated in FIG. 1D, in a second direction X, the signal lines at the left region are sequentially the trigger signal line ESTV, the first clock signal line ECK, the second clock signal line ECB, and the first of first power lines VGL, the signal line at the middle is the second power line VGH; the signal line at the rightmost is the second of first power lines VGL. As illustrated in FIG. 1D, the input transistor T1, the first control transistor T2, and the second control transistor T3 are side by side along a first direction Y in space, that is, the input transistor T1, the first control transistor T2, and the second control transistor T3 are in an up-down arrangement on the display substrate as illustrated in FIG. 1D; for example, in the first direction Y, the second control transistor T3 is below the first control transistor T2, this causes the wire between the source electrode and the drain electrode of the first control transistor T2 and the second control transistor T3 is relatively long and a larger space is occupied; in addition, for the convenience of connecting the drain electrode of the second control transistor T3 and the drain electrode of the output transistor T10 to the first power line VGL to receive the first voltage, in the second direction X, two first power lines VGL that are the same are both provided at the left region (as illustrated in FIG. 1D, the side closer to the second control transistor T3) and the right region (as illustrated in FIG. 1D, the side closer to the output transistor T10) of the display substrate, which results in a waste of space of the display substrate, and is adverse to the realization of a display substrate with a narrow bezel.

At least one embodiment of the present disclosure provides a display substrate, which includes: a base substrate, including a display region and a periphery region on at least one side of the display region; and a shift register unit, a first power line and a second power line, which are on the periphery region of the base substrate. The first power line is configured to provide a first voltage to the shift register unit, the second power line is configured to provide a second voltage to the shift register unit; the shift register unit includes an input circuit, a first node control circuit, a second node control circuit, a third node control circuit, a fourth node control circuit, and an output control circuit; the input circuit is configured to input an input signal to a first node in response to a first clock signal; the second node control circuit is connected to the first power line, and is configured to input the first voltage provided by the first power line or the first clock signal to a second node, under control of the first clock signal and an electrical level of the first node, so as to control an electrical level of the second node; the first node control circuit is connected to the second power line, and is configured to input the second voltage provided by the second power line to the first node under control of a second clock signal and the electrical level of the second node, so as to perform noise reduction on the first node; the third node control circuit is configured to control an electrical level of the third node in response to the electrical level of the second node; the fourth node control circuit is configured to input the electrical level of the third node to the fourth node under control of the second clock signal; the output control circuit is connected to the second power line and an output terminal, and is configured to output the second voltage which is provided by the second power line and serves as an output signal, to the output terminal under control of an electrical level of the fourth node; and an orthographic projection of the first power line on the base substrate is on a side of an orthographic projection of the shift register unit on the base substrate closer to the display region, an orthographic projection of the second power line on the base substrate is on a side of the orthographic projection of the shift register unit on the base substrate away from the display region, and the orthographic projection of the shift register unit on the base substrate is between the orthographic projection of the first power line on the base substrate and the orthographic projection of the second power line on the base substrate.

At least one embodiment of the present disclosure further provides a display device and a manufacturing method of a display substrate corresponding to the above-mentioned display substrate.

The display substrate provided by the above-mentioned embodiments of the present disclosure optimizes connections between wires and the layout of structures in the shift register unit, reduce an amount (number) of wires (for example, a first power line), and reduces the length in the second direction of the shift register unit to a certain extent, and reduce the size of the shift register unit, this design is in favor of realizing a design of a display substrate with a narrow bezel while guaranteeing the display quality of the display substrate.

In the following, embodiments of the present disclosure and some examples of embodiments of the present disclosure are described in detail with reference to accompanying drawings.

Figure 2:
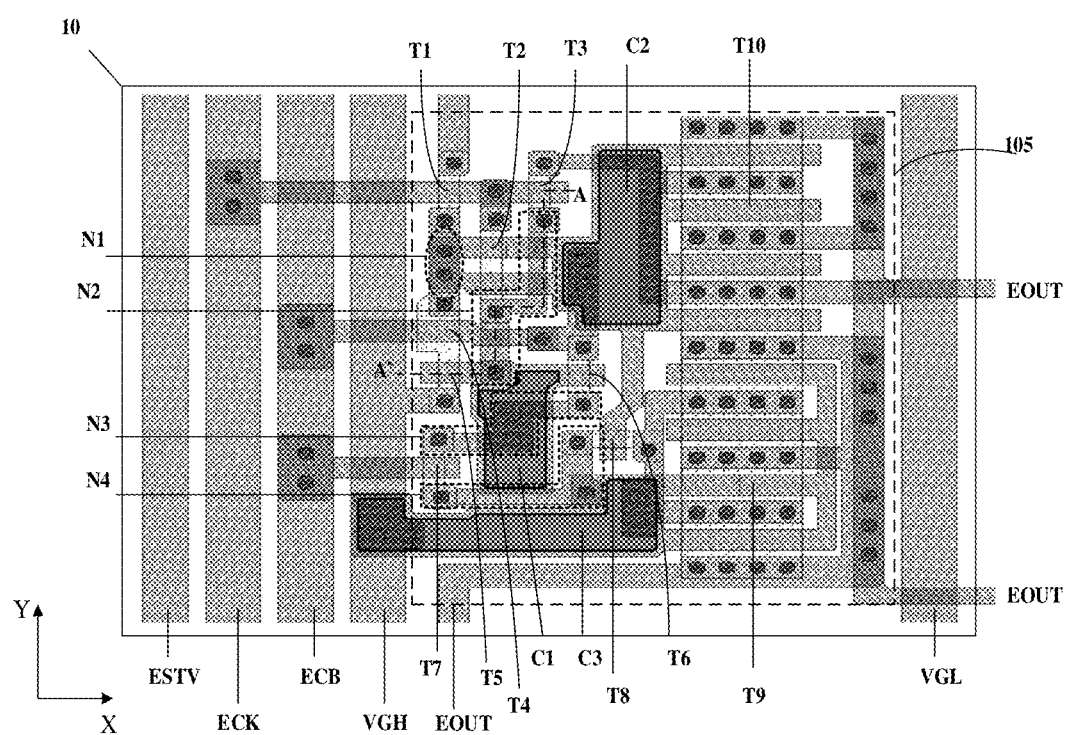
FIG. 2 is a schematical layout diagram of a display substrate provided by at least one embodiment of the present disclosure.

At least one embodiment of the present disclosure provides a display substrate. FIG. 2 is a schematical layout diagram of the light-emitting-control shift register unit 105 as illustrated in FIG. 1B on a display substrate.

For example, as illustrated in FIG. 2, the display substrate 1 includes: a base substrate 10, and a shift register unit 105, a first power line VGL, a second power line VGH, and a plurality of clock signal lines (for example, a first clock signal line ECK, a second clock signal line ECB, and a trigger signal line ESTV as illustrated in FIG. 2) which are on the base substrate 10. For example, the shift register unit is the light-emitting-control shift register unit 105; for the sake of convenience and conciseness of descriptions, in embodiments of the present disclosure, descriptions are given by enabling the light-emitting-control shift register unit 105 be abbreviated as the shift register unit.

For example, the first power line VGL, the second power line VGH, and the plurality of clock signal lines (for example, the first clock signal line ECK, the second clock signal line ECB, and the trigger signal line ESTV) extend along on the first direction Y on the base substrate 10, and is configured to respectively provide a first voltage, a second voltage and a plurality of clock signals (for example, the first clock signal, the second clock signal or the trigger signal, or the like, as described above) to the shift register unit 105. For example, the first power line VGL is configured to provide the first voltage to the shift register unit 105, and the second power line VGH is configured to provide the second voltage to the shift register unit 105; the first clock signal line ECK and the second clock signal line ECB are configured to respectively provide the first clock signal or the second clock signal to the shift register unit 105. For example, the first voltage is smaller than the second voltage; for example, the first voltage is a direct-current low electric level, and the second voltage is a direct-current high electric level. Specific connections between the shift register unit 105 and each of the first power line VGL, the second power line VGH, and the plurality of clock signal lines may refer to the following descriptions.

It should be noted that, the first power line VGL, the second power line VGH, and the plurality of clock signal lines may be parallel to each other and extend along the first direction Y, or may be intersected with each other to form a certain angle therebetween (for example, the certain angle is smaller than or equal to 20 degrees), and no limitation will be given in embodiments of the present disclosure in this respect.

For example, the base substrate 10 may adopt glass, plastic, quartz or other suitable materials, and no limitation will be given in embodiments of the present disclosure in this respect.

For example, the display substrate 1 includes a display region 102 (for example, the display region 102 is referred to as a pixel array region) and a periphery region 106 on at least one side of the pixel array region; for example, the first power line VGL, the second power line VGH, the plurality of clock signal lines, and the shift register unit 105, which are described above, are on the periphery region 106 of the base substrate 10, and are at one side of the base substrate 10 (as illustrated in FIG. 1A, are between the display region 102 and a side edge of the base substrate 10); for example, as illustrated in FIG. 1A, the first power line VGL, the second power line VGH, the plurality of clock signal lines, and the shift register unit 105 are at the left side region of the base substrate 10; obviously, in another example, the first power line VGL, the second power line VGH, the plurality of clock signal lines, and the shift register unit 105 are at the right side region of the base substrate 10 or are at two side regions, that is, the left side region and the right side region, of the base substrate 10, and no limitation will be given in embodiments of the present disclosure in this respect.

For example, an orthographic projection of the first power line VGL on the base substrate 10 is on a side of an orthographic projection of the shift register unit 105 on the base substrate 10 closer to the display region 102; for example, in the second direction X, the orthographic projection of the first power line VGL on the base substrate 10 is on the right side of the shift register unit 105 as illustrated in FIG. 2, that is, the orthographic projection of the first power line VGL on the base substrate 10 is between the orthographic projection of the shift register unit 105 on the base substrate 10 and the display region 102; an orthographic projection of the second power line VGH and orthographic projections of the plurality of clock signal lines on the base substrate 10 is on a side of the orthographic projection of the shift register unit 105 on the base substrate 10 away from the display region 102; for example, in the second direction X, the orthographic projection of the second power line VGH and the orthographic projections of the plurality of clock signal lines on the base substrate 10 are on the left side of the shift register unit 105 as illustrated in FIG. 2; that is, the orthographic projection of the shift register unit 105 on the base substrate 10 is between the orthographic projection of the first power line VGL on the base substrate 10 and the orthographic projection of the second power line VGH on the base substrate 10.

For example, in embodiments of the present disclosure, through adopting the above-mentioned circuit layout, the amount of the first power line VGL connected to the shift register unit 105 is only one and at the left region of the display substrate; that is, as illustrated in FIG. 2, the second control transistor T3 and the output transistor T10 in the shift register unit 105 share the same one first power line VGL, and therefore, the amount of a power lines is reduced, and it can provide only one first power line VGL in the entire circuit layout to satisfy the design requirement, this significantly saves the space of the circuit layout, and in favor of realizing a design of a display substrate with a narrow bezel.

For example, as illustrated in FIG. 2, the orthographic projection of the second power line VGH on the base substrate 10 is between the orthographic projection of the first clock signal line ECK and the second clock signal line ECB on the base substrate 10 and the orthographic projection of the shift register unit 105 on the base substrate 10. For example, the trigger signal line ESTV, the first clock signal line ECK and the second clock signal line ECB sequentially arranged from the left to the right along the second direction X on the base substrate 10.

It should be noted that, the positions of the above-mentioned wires are only examples, as along as the requirement that the arrangement of above-mentioned wires is in favor of connecting the above-mentioned wires to the shift register unit, and no limitation will be given in embodiments of the present disclosure in this respect.

For example, the angle between the first direction Y and the second direction X ranges from 70°-90°, and 70° and 90° are included. For example, the angle between the first direction Y and the second direction X is 70°, 75°, 85°, 90°, 80°, or the like, the angle between the first direction Y and the second direction X may be set according to actual implementation, and no limitation will be given in embodiments of the present disclosure in this respect.

For example, the display region 102 includes a plurality of pixel unit 103 which are arranged in an array. For example, each of the plurality of pixel unit 103 includes a pixel circuit, for example, may further include a light-emitting element (not illustrated in figures).

For example, the plurality of shift register units 105 that are cascaded form a light-emitting-control drive circuit array (EM GOA). For example, output terminals EOUT of the plurality of shift register units 105 are respectively connected to light-emitting control signal terminals of respective rows of pixel circuits in the pixel array region, so as to provide output signals (for example, light-emitting control signals) to the respective rows of pixel circuits, to drive the light-emitting elements to emit light. For example, the pixel circuits may be pixel circuits adopting circuit structures, such as 7T1C, 2T1C, 4T2C, 8T2C in the art, and no further descriptions will be given here.

FIG. 2 only illustrates a shift register unit 105 at an X-th stage in the gate drive circuit. For example, a first clock signal terminal CK (as illustrated in FIG. 1B) of the shift register unit at the first stage (not illustrated in figures) is connected to the first clock signal line ECK to receive the first clock signal; a second clock signal terminal CB of the shift register unit 105 at the first stage is connected to the second clock signal line ECB to receive the second clock signal; a first clock signal terminal CK of the shift register unit at the second stage (not illustrated in figures) is connected to the second clock signal line ECB to receive the first clock signal, and a second clock signal terminal CB of the shift register unit at the second stage is connected to the first clock signal line ECK to receive the second clock signal, and so on; as illustrated in FIG. 2, the first clock signal terminal CK of the shift register unit 105 at the X-th (X is an odd number that is greater than or equal to 1) stage is connected to the first clock signal line ECK to receive the first clock signal, a second clock signal terminal CB of the shift register unit 105 at the X-th stage is connected to the second clock signal line ECB to receive the second clock signal; a first clock signal terminal CK of the shift register unit at the (X+1)-th stage is connected to the second clock signal line ECB to receive the first clock signal; a second clock signal terminal CB of the shift register unit at the (X+1)-th stage is connected to the first clock signal line ECK to receive the second clock signal. It should be noted that, the connections between the shift register units at respective stages and the clock signal lines may also adopt other connections in the art, and no limitation will be given in embodiments of the present disclosure in this respect. For example, the input terminal EI of the shift register unit at the first stage is connected to the trigger signal line ESTV to receive the trigger signal serving as the input signal; the input terminal of the shift register unit 105 at the second stage is connected to the output terminal EOUT of the shift register unit at an previous stage (that is, the shift register unit at the first stage), and the connections for the shift register unit at other stages are similar to the connection as described above. In the following, descriptions are given by taking the structure of the shift register unit 105 at the X-th stage as an example, and no limitation will be given in embodiments of the present disclosure in this respect.

For example, as illustrated in FIG. 1B, in some examples, the shift register unit 105 includes an input circuit 1041, a first node control circuit 1042, a second node control circuit 1043, a third node control circuit 1044, a fourth node control circuit 1045, and an output control circuit 1046; and in some other examples, the shift register unit 105 further includes an output circuit 1047 and a fourth node noise reduction circuit 1048.

The input circuit 1041 is configured to input the input signal received by the input terminal EI to the first node N1 in response to the first clock signal. For example, the input circuit 1041 is connected to the input terminal EI, the first node N1, and the first clock signal terminal CK (the first clock signal terminal CK of the shift register unit 105 at the X-th stage is connected to the first clock signal line ECK to receive the first clock signal, and the first clock signal terminal CK of the shift register unit at the (X+1)-th stage is connected to the second clock signal line ECB to receive the first clock signal), and is configured to be turned on under control of the first clock signal received by the first clock signal terminal CK, to enable the input terminal EI to be connected to the first node N1, and to input the input signal to the first node N1. For example, the input circuit 1041 is implemented as the input transistor T1 as described above, the connection for the input transistor T1 may refer to the descriptions above, and no further descriptions will be given here.

The second node control circuit 1043 is connected to the first power line VGL, and is configured to input the first voltage provided by the first power line VGL or the first clock signal to the second node N2 under control of the first clock signal and the electrical level of the first node N1, so as to control the electrical level of the second node N2. For example, the second node control circuit 1043 is connected to the first power line VGL, the first node N1, the first clock signal terminal CK, and the second node N2, and is configured to be turned on under control of the first clock signal received by the first clock signal terminal CK and the electrical level of the first node N1, input the first voltage provided by the first power line VGL or the first clock signal to the second node N2, so as to control the electrical level of the second node N2. For example, the second node control circuit 1043 is implemented as the first control transistor T2 and the second control transistor T3, as described above, the connections for the first control transistor T2 and the second control transistor T3 may refer to the descriptions above, and no further descriptions will be given here. It should be noted that, the second node control circuit 1043 is not limited to be connected to the first node N1, and may also be connected to other independent voltage terminal (which provides a voltage that is the same as the voltage at the first node N1), or be connected to a circuit that is the same as the input circuit and provided separately, and no limitation will be given in embodiments of the present disclosure in this respect. The connections for other circuits in the shift register unit are similar, and no further descriptions will be given here.

The first node control circuit 1042 is connected to the second power line VGH, and is configured to input the second voltage provided by the second power line VGH to the first node N1, under control of the second clock signal and the electrical level of the second node N2, so as to perform noise reduction on the first node N1. For example, the first node control circuit 1042 is connected to the second power line VGH, the second clock signal terminal CB (the second clock signal terminal CB of the shift register unit 105 at the X-th stage is connected to the second clock signal line ECB to receive the second clock signal, and the second clock signal terminal CB of the shift register unit at the (X+1)-th stage is connected to the first clock signal line ECK to receive the second clock signal), the second node N2, and the first node N1, and is configured to be turned on under control of the second clock signal received by the second clock signal terminal CB and the electrical level of the second node N2, so as to enable the second power line VGH to be connected to the first node N1, to input the second voltage provided by the second power line VGH to the first node N1, and perform noise reduction on the first node N1. For example, the first node control circuit 1042 is implemented as the first noise reduction transistor T4 and the second noise reduction transistor T5, as described above; the connections for the first noise reduction transistor T4 and the second noise reduction transistor T5 may refer to the descriptions above, and no further descriptions will be given here. It should be noted that, the first node control circuit 1042 is not limited to be connected to the second node N2, and may also be connected to other independent voltage terminal (which provides a voltage that is the same as the voltage at the second node N2) or be connected to a circuit that is the same as the second node control circuit 1043 and provided separately, and no limitation will be given in embodiments of the present disclosure in this respect. The connections for other circuits in the shift register unit are similar, and no further descriptions will be given here.

The third node control circuit 1044 is configured to control the electrical level at the third node N3 in response to the electrical level of the second node N2. For example, the third node control circuit 1044 is connected to the second clock signal terminal CB, the second node N2, and the third node N3, and is configured to be turned on in response to the electrical level of the second node N2, so as to enable the second clock signal terminal CB be connected to the third node N3, so as to control the electrical level at the third node N3. For example, the third node control circuit 1044 is implemented as the third control transistor T6 and the first capacitor C1, as described above; the connections for the third control transistor T6 and the first capacitor C1 may refer to the descriptions above, and no further descriptions will be given here. It should be noted that, the third node control circuit 1044 is not limited to be connected to the second node N2, and may also be connected to other independent voltage terminal (which provides a voltage that is the same as the voltage at the second node N2) or be connected to a circuit that is the same as the second node control circuit 1043 and provided separately, and no limitation will be given in embodiments of the present disclosure in this respect. The connections for other circuits in the shift register unit are similar, and no further descriptions will be given here.

The fourth node control circuit 1045 is configured to input the electrical level at the third node N3 to the fourth node N4, under control of the second clock signal. For example, the fourth node control circuit 1045 is connected to the second clock signal terminal CB, the third node N3, and the fourth node N4, and is configured to be turned on under control of the second clock signal received by the second clock signal terminal CB, and to input the electrical level at the third node N3 to the fourth node N4.

The output control circuit 1046 is configured to output the second voltage which is provided by the second power line VGH and serves as the output signal to the output terminal EOUT. For example, the output control circuit 1046 is connected to the fourth node N4, the output terminal EOUT, and the second power line VGH, and is configured to be turned on under control of the electrical level of the fourth node N4, so as to connect the second power line VGH and the output terminal EOUT, and to output the second voltage serving as the output signal at the output terminal EOUT. For example, the output control circuit 1046 is implemented as the output control transistor T9 and the third capacitor C3, as described above, the connections for the output control transistor T9 and the third capacitor C3 may refer to the descriptions above, and no further descriptions will be given here. It should be noted that, the output control circuit 1046 is not limited to be connected to the fourth node N4, and may also be connected to other independent voltage terminal (which provides a voltage that is the same as the voltage at the fourth node N4) or be connected to a circuit that is the same as the fourth node control circuit 1045 and provided separately, and no limitation will be given in embodiments of the present disclosure in this respect. The connections for other circuits in the shift register unit are similar, and no further descriptions will be given here.

The output circuit 1047 is connected to the first power line VGL and the output terminal EOUT, and is configured to reset the output terminal EOUT under control of the electrical level of the first node N1. For example, the output circuit 1047 is connected to the second clock signal terminal CB, the first node N1, the first power line VGL, and the output terminal EOUT, and is configured to be turned on under control of the electrical level of the first node N1, so as to enable the first power line VGL be connected to the output terminal EOUT, to control the electric level of the output terminal EOUT be a low electric level, and to avoid causing incorrect outputs during a non-outputting phase by the shift register unit. For example, the output circuit 1047 is implemented as the output transistor T10 and the second capacitor C2, as described above; the connections for the output transistor T10 and the second capacitor C2 may refer to the descriptions above, and no further descriptions will be given here. It should be noted that, the output circuit 1047 is not limited to be connected to the first node N1, and may also be connected to other independent voltage terminal (which provides a voltage that is the same as the voltage at the first node N1) or be connected to a circuit that is the same as the input circuit 1041 and provided separately, and no limitation will be given in embodiments of the present disclosure in this respect. The connections for other circuits in the shift register unit are similar, and no further descriptions will be given here.

The fourth node noise reduction circuit 1048 is connected to the second power line VGH, the first node N1, and the fourth node N4, and is configured to perform noise reduction on the fourth node N4 under control of the electrical level of the first node N1. For example, the fourth node noise reduction circuit 1048 is turned on under control of the electrical level of the first node N1, so as to enable the fourth node N4 to be connected to the second power line VGH, and keep the voltage at the fourth node N4 being a high electric level, perform noise reduction on the fourth node N4, avoid causing incorrect outputs by the shift register unit 105. For example, the fourth node noise reduction circuit 1048 may be implemented as the third noise reduction transistor T8, as described above, the connection for the third noise reduction transistor T8 may refer to the descriptions above, and no further descriptions will be given here. It should be noted that, the fourth node noise reduction circuit 1048 is not limited to be connected to the first node N1, and may also be connected to other independent voltage terminal (which provides a voltage that is the same as the voltage at the first node N1) or be connected to a circuit that is the same as the input circuit 1041 and provided separately, and no limitation will be given in embodiments of the present disclosure in this respect. The connections for other circuits in the shift register unit are similar, and no further descriptions will be given here.

It should be noted that, embodiments of the present disclosure illustratively shows only two clock signal lines (the first clock signal line ECK and the second clock signal line ECB), embodiments of the present disclosure may include 4, 6 or 8 clock signal lines, and no limitation will be given in embodiments of the present disclosure in this respect. Correspondingly, in the case where the amount of the clock signal lines is changed, the connections between the shift register unit 105 in the display substrate and the clock signal lines are also changed, specific details may refer to design in the art, and no further descriptions will be given here.

Figure 3:
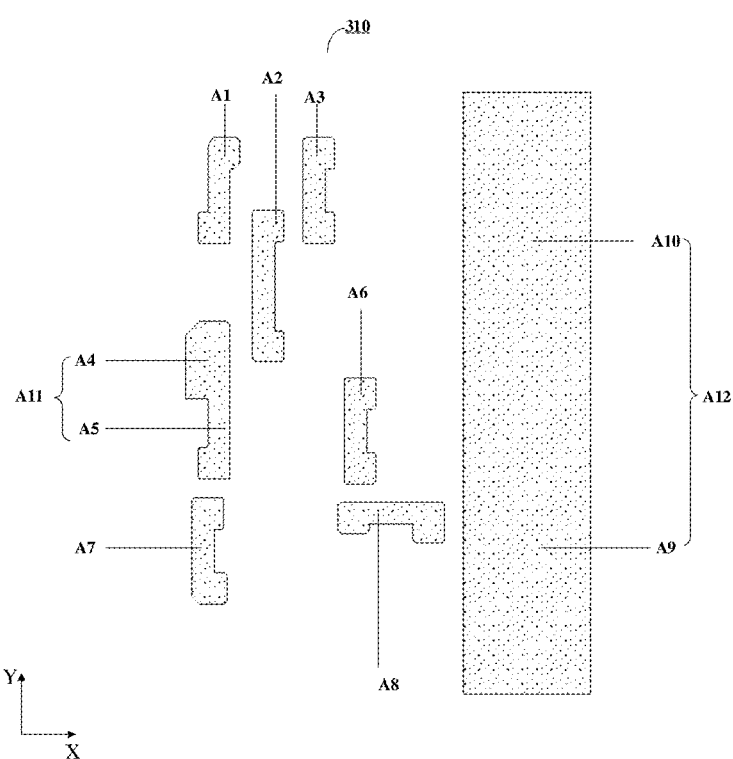
FIG. 3 is a plan diagram of a semiconductor layer of a display substrate provided by at least one embodiment of the present disclosure.
Figure 4:
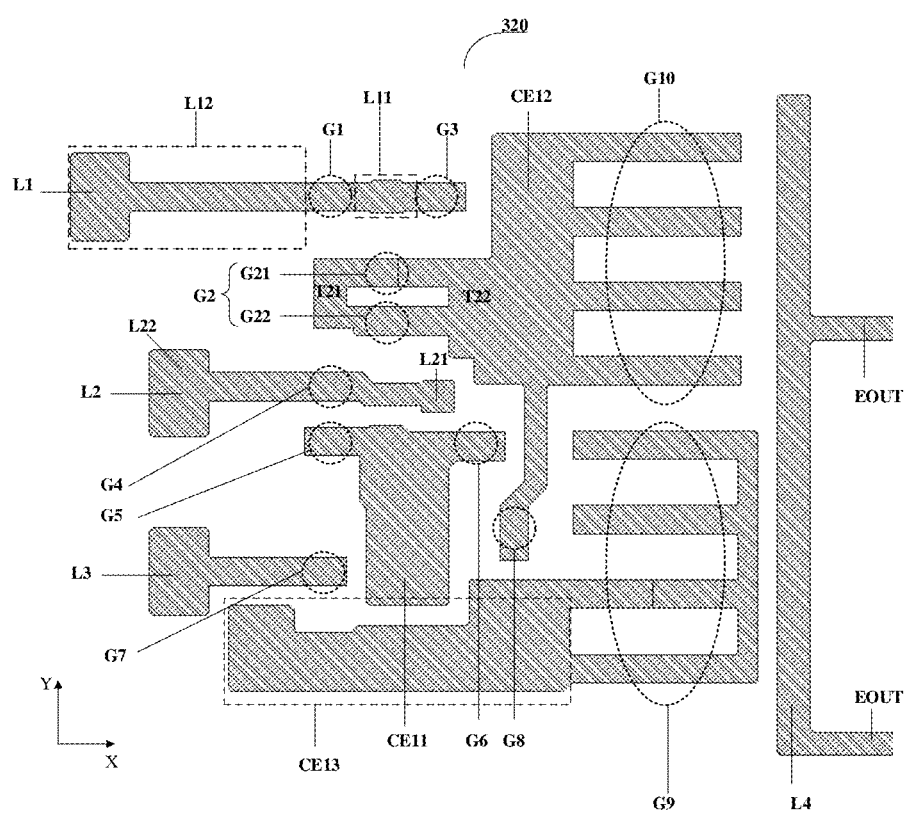
FIG. 4 is a plan diagram of a first conductive layer of a display substrate provided by at least one embodiment of the present disclosure.
Figure 5:
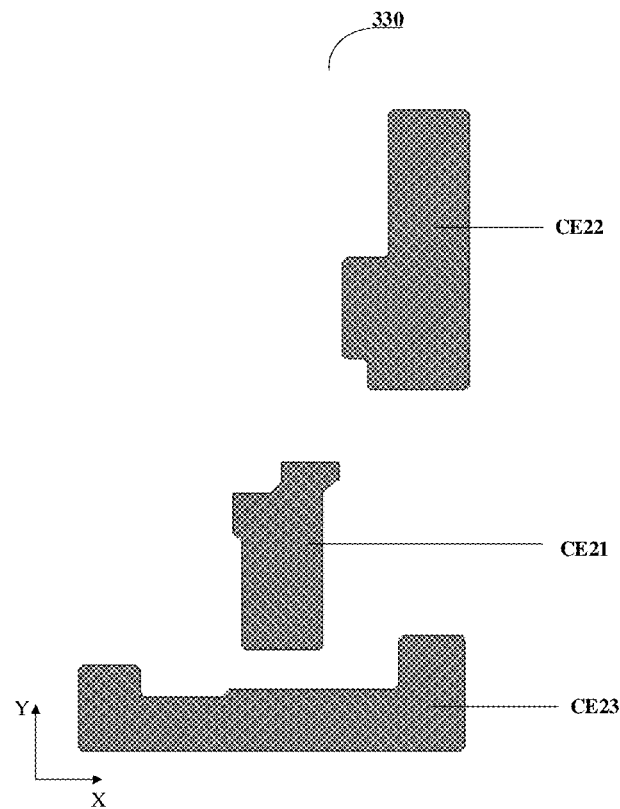
FIG. 5 is a plan diagram of a second conductive layer of a display substrate provided by at least one embodiment of the present disclosure.
Figure 6:
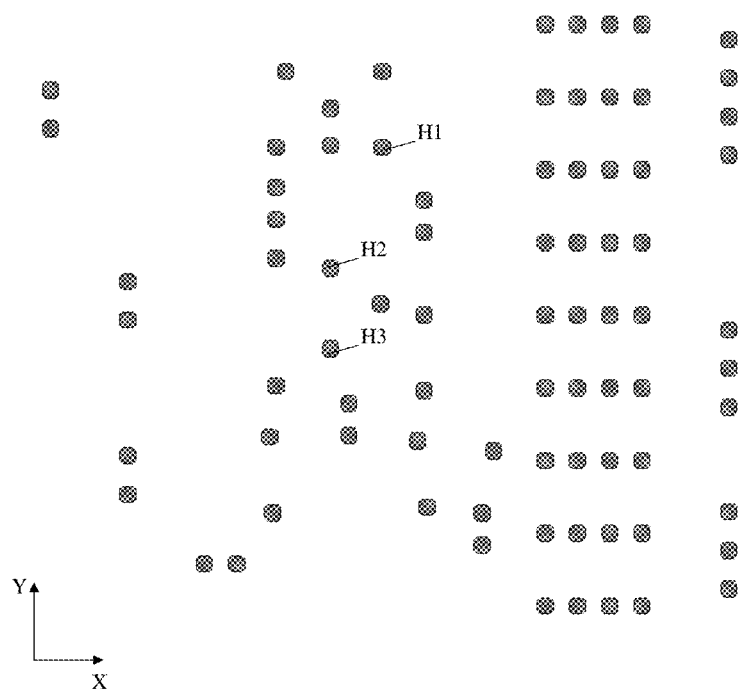
FIG. 6 is a diagram illustrating a distribution of via-holes of a display substrate provided by at least one embodiment of the present disclosure.
Figure 7:
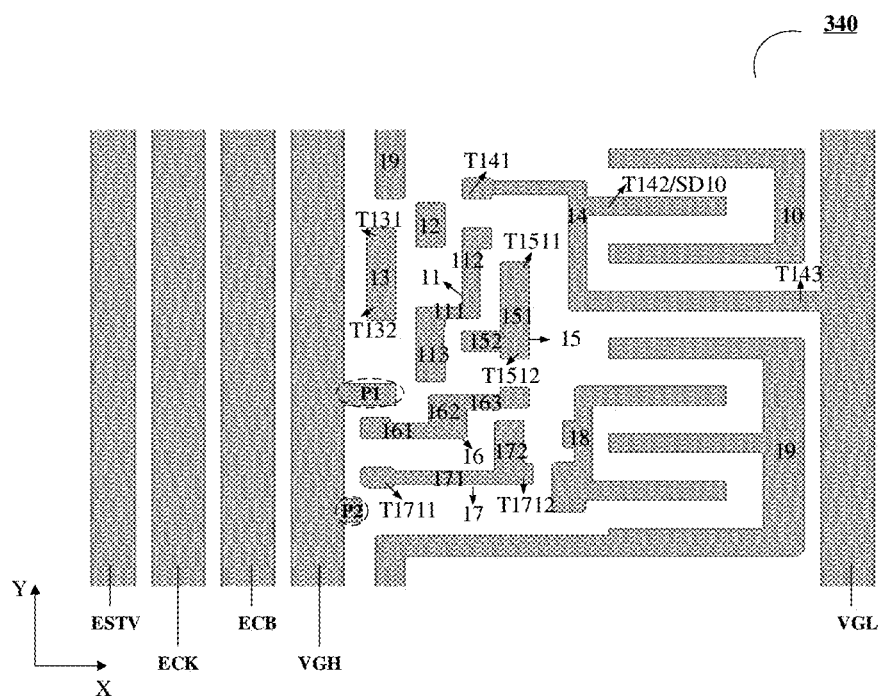
FIG. 7 is a plan diagram of a third conductive layer of a display substrate provided by at least one embodiment of the present disclosure.
Figure 8:
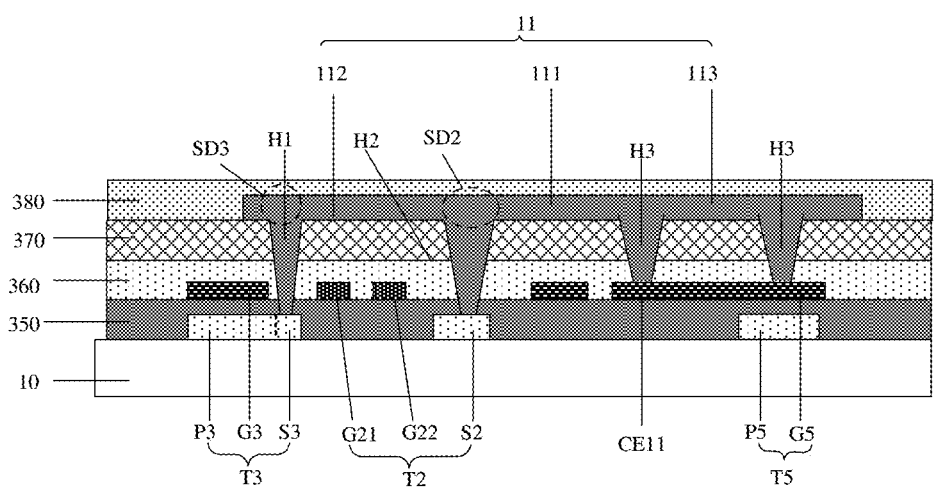
FIG. 8 is a sectional view along the A-A' direction of the display substrate as illustrated in FIG. 2 in some examples.

FIG. 3, FIG. 4, FIG. 5 and FIG. 7 respectively illustrate plan diagrams of wirings in layers of the display substrate as illustrated in FIG. 2. FIG. 3 is a plan diagram of a semiconductor layer of a display substrate provided by at least one embodiment of the present disclosure; FIG. 4 is a plan diagram of a first conductive layer of a display substrate provided by at least one embodiment of the present disclosure; FIG. 5 is a plan diagram of a second conductive layer of a display substrate provided by at least one embodiment of the present disclosure; FIG. 6 is a diagram illustrating a distribution of via-holes of a display substrate provided by at least one embodiment of the present disclosure; FIG. 7 is a plan diagram of a third conductive layer of a display substrate provided by at least one embodiment of the present disclosure; FIG. 8 is a sectional view along the A-A' direction of the display substrate as illustrated in FIG. 2 in some examples. In the following, a laminated structure of the display substrate provided by at least one embodiment of the present disclosure is described in detail with reference to FIG. 3-FIG. 8.

For example, an interlayer insulation layer (for example, including a first insulation layer, a second insulation layer, a third insulation layer, and so on) may be between the layers, including structures, as illustrated in FIG. 3 to FIG. 7. For example, the first insulation layer 350 (as illustrated in FIG. 8) is between the semiconductor layer 310 as illustrated in FIG. 3 and the first conductive layer 320 as illustrated in FIG. 4; the second insulation layer 360 (as illustrated in FIG. 8) is between the first conductive layer 320 as illustrated in FIG. 4 and the second conductive layer 330 as illustrated in FIG. 5; the third insulation layer 370 (as illustrated in FIG. 8) is between the second conductive layer 330 as illustrated in FIG. 5 and the third conductive layer 340 as illustrated in FIG. 7. The via-holes as illustrated in FIG. 6 are via-holes running through one layer or a plurality layers of the first insulation layer 350, the second insulation layer 360 or the third insulation layer 370.

For example, as illustrated in FIG. 8, the display substrate 1 further includes a fourth insulation layer 380, the fourth insulation layer 380 is on the third conductive layer 340, and is used for protecting the third conductive layer 340.

For example, the materials of the first insulation layer 350, the second insulation layer 360, the third insulation layer 370 and the fourth insulation layer 380 may include, for example, an inorganic insulation material, such as SiNx, SiOx, SiNxOy, and so on, for example, an organic insulating material, such as organic resin, or other suitable materials, and no limitation will be given in embodiments of the present disclosure in this respect.

It should be noted that, the display substrate as illustrated in FIG. 2 are described by taking the layout design for the shift register unit at the X-th stage in the light-emitting-control drive circuit array, and the first power line, the second power line and signal lines that are connected to the shift register unit at the X-th stage as an example, the implementation of the layout for the shift register unit at the other stages may refer to the layout as illustrated in FIG. 2, and no further descriptions will be given here; obviously, other layouts can be adopted, and no limitation will be given in embodiments of the present disclosure in this respect. Obviously, the layout of respective stages of the shift register units of the remaining light-emitting-control drive circuit arrays may refer to the layout illustrated in FIG. 2, or may adopt other layouts, and no limitation will be given in embodiments of the present disclosure in this respect.

In the following, the display substrate provided by at least one embodiment of the present disclosure is described in detail with reference to FIG. 2-FIG. 8.

For example, the active layers of the input transistor T1 to the output transistor T10 of the shift register unit 105 as illustrated in FIG. 2 may be formed in the semiconductor layer 310 as illustrated in FIG. 3. The semiconductor layer 310 may be formed through a patterning process for a semiconductor material. For example, as illustrated in FIG. 3, according to demands, the semiconductor layer 310 may include a pattern with a shape of a short rod or a pattern having a curved or bent shape, and the semiconductor layer 310 is used for forming the active layers of the above-mentioned input transistor T1 to output transistor T10. Each active layer may include a source electrode region, a drain electrode region, and a channel region that is between the source electrode region and the drain electrode region. For example, the channel region has semiconductor characteristics; the source electrode region and the drain electrode region are at two sides of the channel region, and may be doped with impurities, and therefore, the source electrode region and the drain electrode region are conductive. For example, the source electrode region is part of the active layer, the metal electrode (for example, in the third conductive layer 340) that is in contact with the source electrode region corresponds to the source electrode (or is denoted as the first electrode) of a transistor; the drain electrode region is a part of the active layer, the metal electrode (for example, in the third conductive layer 340) that is in contact with the drain electrode region corresponds to the drain electrode (or is denoted as the second electrode) of a transistor. For example, the source electrode region is connected to the metal electrode (the source electrode) corresponding to the source electrode region through a via-hole running through the first insulation layer 350, the second insulation layer 360, and the third insulation layer 370; the drain electrode region is connected to the metal electrode (the drain electrode) corresponding to the drain electrode region through a via-hole running through the first insulation layer 350, the second insulation layer 360, and the third insulation layer 370.

For example, as illustrated in FIG. 8, by taking the second control transistor T3 as an example, the active layer of the second control transistor T3 includes a source electrode region S3, a drain electrode region (not illustrated in figures) and a channel region P3; the second control transistor T3 further includes a gate electrode G3; for example, the gate electrode G3 is in the first conductive layer 320, and other transistors are similar in this respect, and no further descriptions will be given here.

For example, the material of the semiconductor layer 310 may include an oxide semiconductor, an organic semiconductor, an amorphous silicon, a polysilicon, and so on; for example, the oxide semiconductor includes a metal oxide semiconductor (for example, indium gallium zinc oxide (IGZO)); the polysilicon includes a low temperature polysilicon or a high temperature polysilicon, and so on, and no limitation will be given in embodiments of the present disclosure in this respect. It should be noted that, the above-mentioned source electrode region and drain electrode region may be regions doped with n-type impurities or p-type impurities, and no limitation will be given in embodiments of the present disclosure in this respect.

It should be noted that, in some other examples, the first electrode and the second electrode of a transistor may be in other conductive layers, and are connected to corresponding regions of the active layer through via-holes in an insulation layer between the first and the second electrodes and the semiconductor layer, and no limitation will be given in embodiments of the present disclosure in this respect.

FIG. 4 illustrates the first conductive layer 320 of the display substrate, the first conductive layer 320 is on the first insulation layer, so as to enable the first conductive layer 320 to be insulated with the semiconductor layer 310. For example, the first conductive layer 320 may include the first electrodes CE11, CE12, CE13 of the first capacitor C1 to the third capacitor C3, the gate electrodes of the input transistor T1 to the output transistor T10, and the wires (for example, the first connection wire L1, the second connection wire L2, and the third connection wire L3) that are directly connected to the gate electrodes; correspondingly, the first insulation layer 350 also serves as a gate insulation layer. As illustrated in FIG. 4, the gate electrodes of the input transistor T1 to the output transistor T10 is portions that are circled by a circular or oval dotted line, that is, the gate electrodes are portions, which overlap semiconductor layer structures of the transistors, of wires of the first conductive layer 320.

FIG. 5 illustrates the second conductive layer 330 of the display substrate; the second conductive layer 330 includes the second electrodes CE21, CE22, CE23 of the first capacitor C1 to the third capacitor C3. The second electrode CE21 at least partially overlaps the first electrode CE11 to form the first capacitor C1, the second electrode CE22 at least partially overlaps the first electrode CE12 to form the second capacitor C2, and the second electrode CE23 at least partially overlaps the first electrode CE13 to form the third capacitor C3.

FIG. 7 illustrates the third conductive layer 340 of the display substrate, the third conductive layer 340 includes a plurality of signal lines (for example, the trigger signal line ESTV connected to the input terminal of the shift register unit 105 at the first stage, the first clock signal line ECK, and the second clock signal line ECB), the second power line VGH, the first power line VGL, and so on. It should be noted that, the third conductive layer 340 further includes a first transfer-connection electrode 11, a second transfer-connection electrode 12, a third transfer-connection electrode 13, a fourth transfer-connection electrode 14, a fifth transfer-connection electrode 15, a sixth transfer-connection electrode 16, a seventh transfer-connection electrode 17, an eighth transfer-connection electrode 18, a ninth transfer-connection electrode 19, and a tenth transfer-connection electrode 10, and so on, which are for connecting transistors, capacitors and signal lines.

As illustrated in FIG. 2 to FIG. 7, the plurality of signal lines, the second power line VGH, and the first power line VGL are connected to transistors and capacitors, which are in other layers and required to be connected to the plurality of signal lines, the second power line VGH, and the first power line VGL, through at least one via-hole as illustrated in FIG. 6, transistors are connected to corresponding capacitors through at least one via-hole, or through bridge connection of the transfer-connection electrode, and no further descriptions will be given here.

For example, the material of the above-mentioned third conductive layer 340 may include titanium, titanium alloy, aluminum, aluminum alloy, copper, copper alloy or any other suitable composite materials, and no limitation will be given in embodiments of the present disclosure in this respect. For example, the materials of the first conductive layer 320 and the second conductive layer 330 may be the same as the material of the third conductive layer 340, and no further descriptions will be given here.

It should be noted that, the shift register unit in embodiments of the present disclosure includes the above-mentioned transistors, capacitors, and transfer-connection electrodes for connecting the transistors and capacitors, and no limitation will be given in embodiments of the present disclosure in this respect.

FIG. 2 is a schematic diagram illustrating the position relationship for a lamination of the semiconductor layer 310 as illustrated in FIG. 3, the first conductive layer 320 as illustrated in FIG. 4, the second conductive layer 330 as illustrated in FIG. 5, and the third conductive layer 340 as illustrated in FIG. 7, which are mentioned above. In the following, with reference to FIG. 2-FIG. 8, the display substrate provided by at least one embodiment of the present disclosure are described in detail.

For example, as illustrated in FIG. 2 and FIG. 3, in at least one example, the active layer of the first control transistor T2 and the active layer of the second control transistor T3 extend along the first direction Y, an orthographic projection of the active layer of the first control transistor T2 on the base substrate 10 is on a side of an orthographic projection of the active layer of the second control transistor T3 on the base substrate 10 away from the display region 102.

For example, the active layer of the input transistor T1 extends along the first direction Y; an orthographic projection of the active layer of the input transistor T1 on the base substrate 10 is on a side of an orthographic projection of the active layer of the first control transistor T2 on the base substrate 10 away from the display region 102. For example, the orthographic projection of the active layer of the input transistor T1 on the base substrate 10 and the orthographic projection of the active layer of the second control transistor T3 on the base substrate 10 are side by side in the second direction X. That is, the orthographic projection of the active layer of the first control transistor T2 on the base substrate 10 is between the orthographic projection of the active layer of the input transistor T1 on the base substrate 10 and the orthographic projection of the active layer of the second control transistor T3 on the base substrate 10. It should be noted that, the orthographic projection of the active layer of the input transistor T1 on the base substrate 10 and the orthographic projection of the active layer of the second control transistor T3 on the base substrate 10 are staggered (spaced apart from each other) in the second direction X and with a certain distance therebetween, as along as the arrangements of other structures are not adversely influenced and the size of the shift register unit is increased not too much, and no limitation will be given in embodiments of the present disclosure in this respect.

In embodiments of the present disclosure, the arrangement of the input transistor T1, the first control transistor T2, and the second control transistor T3 on the display substrate is changed from an up-down arrangement along the first direction Y as illustrated in FIG. 1D into an evenly arrangement in a planar shape along the second direction X, that is, evenly arranged in the second direction X, the space in the vertical direction are significantly saved; meanwhile, the second control transistor T3 is closer to the output transistor T10 and the first power line VGL, which are at the right side of the second control transistor T3, this is in favor of enabling both the second control transistor T3 and the output transistor T10 to be connected to same one first power line VGL, such that the amount of a power lines is reduced, and this in favor of realizing a narrow bezel.

For example, as illustrated in FIG. 2 and FIG. 4, the first control transistor T2 includes a first gate electrode G21 and a second gate electrode G22 which are side by side in the first direction Y; for example, the first gate electrode G21 and the second gate electrode G22 extend along the second direction, and are in an "U" shape along the second direction X; the first gate electrode G21 and the second gate electrode G22 (for example, connected to each other), which are side by side, respectively overlap the active layer (for example, the active layer with a strip-shape), extending along the first direction Y, of the first control transistor T2, to obtain a double-gate transistor. Obviously, in another example, the active layer of the first control transistor T2 may be in an "U" shaped structure, and the gate electrode of the first control transistor T1 may be a linear shaped structure overlapping the active layer in an "U" shape, to obtain a double-gate transistor, as along as the arrangements of other structures are not adversely influenced and the size of the shift register unit is increased not too much, and no limitation will be given in embodiments of the present disclosure in this respect.

It should be noted that, the case where single one gate electrode overlaps the active layer of the first control transistor T2 can also be adopted, and no limitation will be given in embodiments of the present disclosure in this respect.

For example, as illustrated in FIG. 2 and FIG. 4, the display substrate further includes a first connection wire L1 extending along the second direction, the first connection wire L1 includes a first portion L11 and a second portion L12. For example, the first portion L11 of the first connection wire L1 is connected to the gate electrode of the second control transistor T3 and the gate electrode of the input transistor T1, and the first portion L11 of the first connection wire L1, the gate electrode of the second control transistor T3, and the gate electrode of the input transistor T1 are integratedly formed; the second portion L12 of the first connection wire L1 and the gate electrode of the input transistor T1 are connected and integratedly formed; that is, the first connection wire L1, the gate electrode of the second control transistor T3 and the gate electrode of the input transistor T1 are integratedly formed. The second portion L12 of the first connection wire L1 is further connected to the first clock signal line ECK in a layer different the layer where the second portion L12 of the first connection wire L1 is located; for example, the second portion L12 of the first connection wire L1 is connected to the first clock signal line ECK through a via-hole running through the second insulation layer 360 and the third insulation layer 370.

For example, as illustrated in FIG. 2 and FIG. 7, the display substrate further includes a second transfer-connection electrode 12; the second electrode of the first control transistor T2 is connected to the second transfer-connection electrode 12; the first portion L11 of the first connection wire L1 is connected to the second transfer-connection electrode 12 through a via-hole running through an insulation layer (for example, a via-hole running through the second insulation layer 360 and the third insulation layer 370), so as to enable the second electrode of the first control transistor T2 to be connected to the gate electrode of the second control transistor T3 and the gate electrode of the input transistor T1, which are in a layer different from the layer where the second electrode of the first control transistor T2 are located, so as to enable all the gate electrode of the input transistor T1, the second electrode of the first control transistor T2 and the gate electrode of the second control transistor T3 be connected to the first clock signal line ECK, in the circuit structure as illustrated in FIG. 1B.

For example, the active layer of the first noise reduction transistor T4 and the active layer of the second noise reduction transistor T5 are in a continuous first semiconductor layer A11 (that is, are integratedly formed); the first semiconductor layer A11 extends along the first direction Y, and the gate electrode of the first noise reduction transistor T4 and the gate electrode of the second noise reduction transistor T5 are side by side in the first direction Y. For example, the gate electrode of the first noise reduction transistor T4 and the gate electrode of the second noise reduction transistor T5 may be parallel to each other; for example, may extends along the second direction X; the extension direction of the gate electrode of the first noise reduction transistor T4 and the extension direction of the gate electrode of the second noise reduction transistor T5 may be not parallel to each other, for example, be intersected with a certain angle therebetween; for example, the angle caused by intersection is smaller than or equal to 20°, or, the angle between a horizontal line and each of the extension direction of the gate electrode of the first noise reduction transistor T4 and the extension direction of the gate electrode of the second noise reduction transistor T5 is smaller than or equal to 20°, and no limitation will be given in embodiments of the present disclosure in this respect, as long as the first noise reduction transistor T4 and the second noise reduction transistor T5 are integratedly arranged, and are structures in an up-down arrangement.

For example, the first semiconductor layer A11 is at the imaginary line, extending along the first direction Y, of the active layer of the input transistor T1, and is on the side of the active layer of the first control transistor T2 away from the active layer of the input transistor T1; that is, as illustrated in FIG. 3, in the first direction Y, the first semiconductor layer A11 is below the active layer of the input transistor T1, the gate electrode of the input transistor T1, the gate electrode of the first noise reduction transistor T4 and the gate electrode of the second noise reduction transistor T5 are side by side in the first direction Y, that is, the input transistor T1 in an up-down arrangement along the first direction Y with respect to the first noise reduction transistor T4 and the second noise reduction transistor T5, such that the width in the second direction X of the shift register unit 105 can be easily reduced, which is in favor of realizing a display substrate with a narrow bezel.

For example, as illustrated in FIG. 2 and FIG. 3, the active layer of the first noise reduction transistor T4 may partially or completely overlap the active layer of the second noise reduction transistor T5 in the first direction Y, that is, the active layer of the first noise reduction transistor T4 may be at an imaginary line, extending along the first direction Y, of the active layer of the second noise reduction transistor T5; in another example, the active layer of the first noise reduction transistor T4 may not overlap the active layer of the second noise reduction transistor T4 in the first direction; for example, the active layer of the first noise reduction transistor T4 and the active layer of the second noise reduction transistor T5 may be staggered in the first direction and with a certain distance therebetween, as along as the arrangements of other structures are not adversely influenced and the size of the shift register unit is increased not too much, and as long as the first noise reduction transistor T4 and the second noise reduction transistor T5 are below the input transistor T1 in the first direction Y, and no limitation will be given in embodiments of the present disclosure in this respect.

For example, as illustrated in FIG. 2 and FIG. 7, the display substrate further includes a third transfer-connection electrode 13; the third transfer-connection electrode 13 extends along the first direction Y, a first end T21 of the first gate electrode G21 and the second gate electrode G22 of the first control transistor T2 is connected to the third transfer-connection electrode 13 through a via-hole running through an insulation layer (for example, a via-hole running through the second insulation layer 360 and the third insulation layer 370); the first electrode of the input transistor T1 is connected to the first end T131 of the third transfer-connection electrode 13; the first electrode of the first noise reduction transistor T4 is connected to a second end T132 of the third transfer-connection electrode 13. For example, the third transfer-connection electrode 13 may serve as the first node N1 in the circuit structure as illustrated in FIG. 1B, such that the gate electrode G2 of the first control transistor T2, the first electrode of the input transistor T1, and the first electrode of the first noise reduction transistor T4 are connected through the third transfer-connection electrode 13.

For example, as illustrated in FIG. 2 and FIG. 7, the second power line VGH includes a first protrusion portion P1 protruding toward the display region 102 in the second direction X. For example, the first protrusion portion P1 and the first semiconductor layer A11 overlap with each other in the direction perpendicular to the base substrate, and are connected to each other through a via-hole; for example, the first protrusion portion P1 and the active layer of the second noise reduction transistor A5 in the first semiconductor layer A11 overlap with each other in the direction perpendicular to the base substrate 10, and are connected through a via-hole running through the first insulation layer 350, the second insulation layer 360, and the third insulation layer 370.

For example, the first electrode of the second noise reduction transistor T5 and the first protrusion portion P1 are connected and integratedly formed, to receive the second voltage, so as to enable the source electrode region of the second noise reduction transistor T5 to be connected to the first electrode of the second noise reduction transistor T5 through a via-hole running through the first insulation layer 350, the second insulation layer 360, and the third insulation layer 370.

For example, the active layer of the third control transistor T6 extends along the first direction Y; and the active layer of the third control transistor T6 and the active layer of the second noise reduction transistor T5 are side by side in the second direction X.

For example, an orthographic projection of the first capacitor C1 on the base substrate 10 is between the orthographic projection of the active layer of the second noise reduction transistor T5 on the base substrate 10 and the orthographic projection of the active layer of the third control transistor T6 on the base substrate 10.

For example, as illustrated in FIG. 2 and FIG. 7, the display substrate further includes a first transfer-connection electrode 11. For example, the first transfer-connection electrode 11 is bent and in a polygonal line shape. For example, the first transfer-connection electrode 11 includes a first portion 111 extending along the second direction X that is different from the first direction Y, a second portion 112 extending along the first direction Y, and a third portion 113 extending along the first direction Y, the second portion 112 and the first portion 111 are integratedly formed, and the third portion 113 and the first portion 111 are integratedly formed.

For example, as illustrated in FIG. 2 and FIG. 7, an orthographic projection of the second portion 112 of the first transfer-connection electrode 11 on the base substrate 10 and the orthographic projection of the active layer of the first control transistor T2 on the base substrate 10 are side by side in the second direction X, and the orthographic projection of the second portion 112 of the first transfer-connection electrode 11 is at the imaginary line along the first direction Y of the orthographic projection of the active layer of the second control transistor T3 on the base substrate 10.

For example, as illustrated in FIG. 8, the first electrode SD2 of the first control transistor T2 and the first portion 111 of the first transfer-connection electrode 11 are connected and integratedly formed, and the first electrode SD3 of the second control transistor T3 is connected to the second portion 112 of the first transfer-connection electrode 11, so as to realize the connection between the first electrode SD2 of the first control transistor T2 and the first electrode SD3 of the second control transistor T3.

For example, the first electrode SD2 of the first control transistor T2 is connected to the source electrode region S2 of the first control transistor T2 through a via-hole H1 running through the first insulation layer 350, the second insulation layer 360, and the third insulation layer 370; the first electrode SD3 of the second control transistor T3 is connected to the source electrode region S3 of the second control transistor T3 through a via-hole H2 running through the first insulation layer 350, the second insulation layer 360, and the third insulation layer 370.

For example, an orthographic projection of the third portion 113 of the first transfer-connection electrode 11 on the base substrate 10 is at the imaginary line along the first direction Y of the orthographic projection of the active layer of the first control transistor T2 on the base substrate 10; an end of the third portion 113 of the first transfer-connection electrode 11 is connected to the gate electrode of the second noise reduction transistor T5, the gate electrode of the third control transistor T6, and the first electrode CE11 of the first capacitor C1, which are in a layer that is different from the layer where the end of the third portion 113 of the first transfer-connection electrode 11 is located. For example, as illustrated in FIG. 2 and FIG. 4, the gate electrode of the second noise reduction transistor T5, the gate electrode of the third control transistor T6, and the first electrode CE11 of the first capacitor C1 are integratedly formed.

Because the gate electrode of the second noise reduction transistor T5 and the first electrode CE11 of the first capacitor C1 are integratedly formed, for example, as illustrated in FIG. 8, the third portion 113 of the first transfer-connection electrode 11 is connected to the first electrode CE11 of the first capacitor C1 and the gate electrode of the second noise reduction transistor T5 through a via-hole H3 running through the second insulation layer 360 and the third insulation layer 370.

For example, the first transfer-connection electrode 11 may serve as the second node N2 in the circuit structure as illustrated in FIG. 1B, such that the first electrode SD2 of the first control transistor T2 and the first electrode SD3 of the second control transistor T3 can be connected to the gate electrode of the second noise reduction transistor T5, the first electrode of the first capacitor C1, and the gate electrode of the third control transistor T6 through the first transfer-connection electrode 11.

For example, through enabling the input transistor T1, the first control transistor T2, and the second control transistor T3 to adopt a planar shape arrangement along the second direction X, that is, evenly arranged in the second direction X, enabling the input transistor T1, the first noise reduction transistor T4 and the second noise reduction transistor T5 to be side by side in the first direction Y, and enabling the second noise reduction transistor T5, the first capacitor C1, and the third control transistor T6 to be side by side in the second direction X, a wire length of the third transfer-connection electrode 13, for connecting the gate electrode G2 of the first control transistor T2, the first electrode of the input transistor T1, and the first electrode of the first noise reduction transistor T4, is reduced; and a wire length of the first transfer-connection electrode 11, for connecting the first electrode SD2 of the first control transistor T2, and the first electrode SD3 of the second control transistor T3 with the gate electrode of the second noise reduction transistor T5, the first electrode of the first capacitor C1, and the gate electrode of the third control transistor T6, is reduced, such that crowded wires, which is caused by the wires being too long, are avoided; signal crosstalk can be avoided, and more space are available, which is in favor of realizing a display substrate with a narrow bezel.

For example, as illustrated in FIG. 2 and FIG. 3, an orthographic projection of the active layer of the output transistor T10 on the base substrate 10 and an orthographic projection of the second capacitor C2 on the base substrate 10 are side by side in the second direction X; the orthographic projection of the second capacitor C2 on the base substrate 10 is between the orthographic projections of the active layer of the first control transistor T2 and the active layer of the second control transistor T3 on the base substrate 10 and the orthographic projection of the active layer of the output transistor T10 on the base substrate 10; the orthographic projection of the second capacitor C2 on the base substrate 10 is at the imaginary line, extending along the first direction Y, of the orthographic projection of the active layer of the third control transistor T6 on the base substrate 10.

For example, the first electrode CE12 of the second capacitor C2 and the second ends T22 of the first gate electrode G21 and the second gate electrode G22 of the first control transistor T2 are connected and integratedly formed; the first electrode CE12 of the second capacitor C2 is further connected to the gate electrode of the output transistor T10, and the first electrode CE12 of the second capacitor C2 and the gate electrode of the output transistor T10 are integratedly formed. For example, the gate electrode of the output transistor T10 includes a plurality of sub-gate electrodes which are side by side in the second direction X.

For example, as illustrated in FIG. 2 and FIG. 7, the display substrate further includes a fourth transfer-connection electrode 14; an orthographic projection of the fourth transfer-connection electrode 14 on the base substrate 10 at least partially overlaps the orthographic projection of the active layer of the output transistor T10 on the base substrate 10; the first end T141 of the fourth transfer-connection electrode 14 and the second electrode of the second control transistor T3 are connected and integratedly formed; the second end T142 of the fourth transfer-connection electrode 14 and the first electrode SD10 of the output transistor T10 are connected and integratedly formed; the third end T143 of the fourth transfer-connection electrode 14 and the first power line VGL are connected and integratedly formed.

For example, the second control transistor T3 and the output transistor T10 can share the first power line VGL at the right side through the fourth transfer-connection electrode 14, such that the amount of the first power lines VGL is reduced, which is in favor of realizing a display substrate with a narrow bezel.

For example, as illustrated in FIG. 2 and FIG. 7, the display substrate further includes a fifth transfer-connection electrode 15; the fifth transfer-connection electrode 15 includes a first portion 151 extending along the first direction Y and a second portion 152 extending along the second direction X.

For example, the first electrode of the third control transistor T6 and the second end T1512 of the first portion 151 of the fifth transfer-connection electrode 15 are connected and integratedly formed; the gate electrode of the first noise reduction transistor T4 is connected to an end of the second portion 152 of the fifth transfer-connection electrode 15 and the second clock signal line ECB, which are in a layer different from the layer where the gate electrode of the first noise reduction transistor T4 is located; the second electrode CE22 of the second capacitor C2 is connected to the first end T1511 of the first portion 151 of the fifth transfer-connection electrode 15 which is in a layer different from the layer where the second electrode CE22 of the second capacitor C2 is located.

For example, the gate electrode of the first noise reduction transistor T4 is connected to the end of the second portion 152 of the fifth transfer-connection electrode 15 through a via-hole running through the second insulation layer 360 and the third insulation layer 370, and is connected to the second clock signal line ECB through a via-hole running through the second insulation layer 360 and the third insulation layer 370; and the second electrode CE22 of the second capacitor C2 is connected to the first end T1511 of the first portion 151 of the fifth transfer-connection electrode 15 through a via-hole running through the third insulation layer 360.

For example, as illustrated in FIG. 2 and FIG. 4, the display substrate further includes a second connection wire L2 extending along the second direction X. For example, the second connection wire L2 and the gate electrode of the first noise reduction transistor T4 are integratedly formed; the first end L21 of the second connection wire L2 is connected to an end of the second portion 152 of the fifth transfer-connection electrode 15 through a via-hole running through an insulation layer (a via-hole running through the second insulation layer 360 and the third insulation layer 370); the second end L22 of the second connection wire L2 is connected to the second clock signal line ECB through a via-hole running through an insulation layer (a via-hole running through the second insulation layer 360 and the third insulation layer 370).

For example, as illustrated in FIG. 2 and FIG. 3, the active layer of the fourth control transistor T7 extends along the first direction Y, and is on the side of the first semiconductor layer A11 away from the active layer of the input transistor T1.

For example, as illustrated in FIG. 2 and FIG. 4, the gate electrode of the fourth control transistor T7, as well as the gate electrode of the first noise reduction transistor T4, the gate electrode of the second noise reduction transistor T5, and the gate electrode of the input transistor T1 are side by side in the first direction Y, such that the width of the shift register unit 105 in the second direction X can be reduced, which is in favor of realizing a design of a display substrate with a narrow bezel.

For example, the gate electrode of the fourth control transistor T7 is connected to the second clock signal line ECB which is in a layer different from the layer where the gate electrode of the fourth control transistor T7 is located. For example, as illustrated in FIG. 2 and FIG. 4, the display substrate further includes a third connection wire L3 extending along the second direction X. For example, the third connection wire L3 and the gate electrode of the fourth control transistor T7 are integratedly formed; an end of the third connection wire L3 is connected to the second clock signal line ECB through a via-hole running through an insulation layer (a via-hole running through the second insulation layer 360 and the third insulation layer 370).

For example, as illustrated in FIG. 2 and FIG. 7, the display substrate further includes a sixth transfer-connection electrode 16. For example, the sixth transfer-connection electrode 16 includes a first portion 161 extending along the second direction X, a second portion 162 extending along the first direction Y, and a third portion 163 extending along the second direction X. For example, as illustrated in FIG. 7, the first portion 161 and the third portion 163 of the sixth transfer-connection electrode 16 are parallel to each other, and the first portion 161 and the third portion 163 of the sixth transfer-connection electrode 16 and the second portion 162 of the sixth transfer-connection electrode 16 are integratedly formed.

For example, as illustrated in FIG. 2, an end of the first portion 161 of the sixth transfer-connection electrode 16 is connected to the first electrode of the fourth control transistor T7; the second portion 162 of the sixth transfer-connection electrode 16 is connected to the second electrode CE21 of the first capacitor C1 which is in a layer different from the layer where the second portion 162 of the sixth transfer-connection electrode 16 is located; an end of the third portion 163 of the sixth transfer-connection electrode 16 is connected to the second electrode of the third control transistor T6.

For example, the second portion 162 of the sixth transfer-connection electrode 16 is connected to the second electrode CE21 of the first capacitor C1 through a via-hole running through the third insulation layer 360.

For example, the sixth transfer-connection electrode 16 may serve as the third node N3 in the circuit structure as illustrated in FIG. 1B, such that the first electrode of the fourth control transistor T7 and the second electrode CE21 of the first capacitor C1 are connected to the second electrode of the third control transistor T6 through the sixth transfer-connection electrode 16.

For example, as illustrated in FIG. 2 and FIG. 3, the active layer of the third noise reduction transistor T8 extends along the second direction X. For example, the orthographic projection of the active layer of the third noise reduction transistor T8 on the base substrate 10 and the orthographic projection of the second capacitor C2 on the base substrate 10 are side by side in the first direction Y; and the orthographic projection of the active layer of the third noise reduction transistor T8 on the base substrate 10 is on the side of the first capacitor C1 closer to the display region 102, and is on the side of the orthographic projection of the active layer of the third control transistor T6 on the base substrate 10 away from the orthographic projection of the second capacitor C2 on the base substrate 10.

For example, as illustrated in FIG. 2 and FIG. 4, the gate electrode of the third noise reduction transistor T8 extends along the first direction Y, and is connected to the first electrode CE12 of the second capacitor C2, the gate electrode of the output transistor T10, and the gate electrode of the first control transistor T2, and the gate electrode of the third noise reduction transistor T8, the first electrode CE12 of the second capacitor C2, the gate electrode of the output transistor T10, and the gate electrode of the first control transistor T2 are integratedly formed.

For example, as illustrated in FIG. 2 and FIG. 3, the active layer of the output control transistor T9 and the active layer of the output transistor T10 are in a continuous second semiconductor layer A12 (that is, are integratedly formed); the second semiconductor layer A12 extends along the first direction Y. For example, the orthographic projection of the active layer of the output control transistor T9 on the base substrate 10 and the orthographic projections of the first capacitor C1 and the third capacitor C3 on the base substrate 10 are side by side in the second direction X.

For example, the third capacitor C3 is on the side of the first capacitor C1 away from the second capacitor C2; the orthographic projection of the second electrode CE23 of the third capacitor C3 on the base substrate 10 extends along the second direction X, and the outline of the third capacitor C3 has a concave structure shape in the first direction Y; the first electrode CE13 of the third capacitor C3 and the gate electrode of the output control transistor T9 are connected and integratedly formed.

For example, the gate electrode of the output control transistor T9 and the gate electrode of the output transistor T10 are side by side in the first direction Y; for example, the gate electrode of the output control transistor T9 and the gate electrode of the output transistor T10 may be parallel to each other, for example, both the gate electrode of the output control transistor T9 and the gate electrode of the output transistor T10 extend along the second direction X; for another example, the extension direction of the gate electrode of the output control transistor T9 and the extension direction of the gate electrode of the output transistor T10 are not parallel to each other; for example, are intersected with each other to form a certain angle therebetween; for example, the angle caused by intersection is smaller than or equal to 20°, or, the angle between a horizontal line and each of the extension direction of the gate electrode of the output control transistor T9 and the extension direction of the gate electrode of the output transistor T10 is smaller than or equal to 20°, and no limitation will be given in embodiments of the present disclosure in this respect, as long as the output control transistor T9 and the output transistor T10 are integratedly provided, and are structures in an up-down arrangement along the first direction Y.

For example, the gate electrode of the output control transistor T9 includes a plurality of sub-gate electrodes which are side by side in the first direction Y.

For example, as illustrated in FIG. 2 and FIG. 7, the second power line VGH further includes a second protrusion portion P2 protruding toward the display region 102 in the second direction X. For example, the third capacitor C3 overlaps the second power line VGH and the second protrusion portion P2 of the second power line VGH in the direction perpendicular to the base substrate 10; the second electrode CE32 of the third capacitor C3 is connected to the second power line VGH and the second protrusion portion P2 of the second power line VGH through a via-hole running through an insulation layer (a via-hole running through the second insulation layer 360 and the third insulation layer 370).

For example, as illustrated in FIG. 2 and FIG. 7, the display substrate further includes a seventh transfer-connection electrode 17. For example, the seventh transfer-connection electrode 17 includes a first portion 171 extending along the second direction X, and a second portion 172 extending along the first direction Y.

For example, a first end T1711 of the first portion 171 of the seventh transfer-connection electrode 17 is connected to the second electrode of the fourth control transistor T7; an end of the second portion 172 of the seventh transfer-connection electrode 17 is connected to the first electrode of the third noise reduction transistor T8; a second end T1712 of the first portion 171 of the seventh transfer-connection electrode 17 is connected to the first electrode CE13 of the third capacitor C3 and the gate electrode of the output control transistor T9, which are in a layer different from the layer where the second end T1712 of the first portion 171 of the seventh transfer-connection electrode 17 is located. For example, the second end T1712 of the first portion 171 of the seventh transfer-connection electrode 17 is connected to the first electrode CE31 of the third capacitor C3 and the gate electrode of the output control transistor T9 through a via-hole running through the second insulation layer 360 and the third insulation layer 370.

For example, the seventh transfer-connection electrode 17 may serve as the fourth node N4 in the circuit structure as illustrated in FIG. 1B, such that the second electrode of the fourth control transistor T7 and the first electrode CE13 of the third capacitor C3 are connected to the gate electrode of the output control transistor T9 through the seventh transfer-connection electrode 17.

For example, as illustrated in FIG. 2 and FIG. 7, the display substrate further includes an eighth transfer-connection electrode 18. For example, the eighth transfer-connection electrode 18 is connected to the second electrode of the third noise reduction transistor T8, the first electrode of the output control transistor T9, and the second electrode CE23 of the third capacitor C3.

For example, as illustrated in FIG. 2 and FIG. 7, the display substrate further includes a ninth transfer-connection electrode 19. For example, the ninth transfer-connection electrode 19 is connected to the second electrode of the output control transistor T9 and the second electrode of the input transistor T1 of the shift register unit at the next stage.

For example, as illustrated in FIG. 2 and FIG. 7, the ninth transfer-connection electrode 19 (that is, the ninth transfer-connection electrode 19 that is at an upper region of the display substrate along the first direction Y) that is connected to the input transistor T1 of the shift register unit 105 at the X-th stage may be the ninth transfer-connection electrode of the shift register unit at the (X−1)-th stage.

For example, as illustrated in FIG. 2, FIG. 4 and FIG. 7, the display substrate further includes a tenth transfer-connection electrode 10 and a fourth connection wire L4. For example, the tenth transfer-connection electrode 10 is connected to the second electrode of the output transistor T10, and is connected to the fourth connection wire L4 which is in a layer different from the layer where the tenth transfer-connection electrode 10 is located; the fourth connection wire L4 is connected to at least one gate line, so as to output the output signal at the output terminal EOUT to the light-emitting control circuit of a pixel unit in the display region. For example, the ninth transfer-connection electrode 19 and the tenth transfer-connection electrode 10 is connected to the fourth connection wire L4 through a via-hole running through the second insulation layer 360 and the third insulation layer 370, so as to realize the connection between the second electrode of the output transistor T10 and the second electrode of the output control transistor T9 and the fourth connection wire L4, to output the output signal to the output terminal EOUT, and then output the output signal to the gate line that is connected to the output terminal EOUT.

For example, as illustrated in FIG. 4, the fourth connection wire L4 is connected to two gate lines, such that same one output signal output by the output terminal EOUT can be output to the light-emitting control circuits of two rows of pixel units, so as to drive the two rows of pixel units to emit light, and the circuit structure of the light-emitting-control drive circuit array can be simplified, which is in favor of realizing a display substrate with a narrow bezel.

For example, as illustrated in FIG. 2 and FIG. 7, the display substrate further includes a gate drive circuit (not illustrated in figures), and a trigger signal line ESTV. For example, the trigger signal line ESTV is configured to provide the trigger signal to the gate drive circuit; the orthographic projection of the trigger signal line ESTV on the base substrate 10 is on the side of the orthographic projections of the first clock signal line ECK and the second clock signal line ECB on the base substrate 10 away from the display region 102. For example, the gate drive circuit is the above mentioned light-emitting-control drive circuit array (EM GOA), which includes a plurality of shift register units 105 that are cascaded, thereby outputting light-emitting control signals line by line can be realized.

For example, the trigger signal line ESTV is connected to the second electrode of the input transistor T1 of the shift register unit at the first stage of the gate drive circuit, so as to provide the trigger signal. Detailed descriptions in this respect may refer to the above-mentioned descriptions, and no further descriptions will be given here.

For example, the widths of the wires in the third conductive layer 340 are set to enable the wires cover corresponding via-holes completely; for example, the line widths of the wires may be larger than the sizes (for example, the diameters of the via-holes) of the corresponding via-holes, and the differences between the line widths of the wires and the sizes (for example, the diameters of the via-holes) of the corresponding via-holes can be equal to or larger than 1 micron; for example, the sizes of the via-holes ranges from 2.0 microns to 2.5 microns; the line widths of the wires covering corresponding via-holes completely in the third conductive layer 340 ranges from 4 microns to 5 microns. For example, the line widths of the output transistor T10 and the output control transistor T9 are set to make the distances between the upper edges of the wires and the upper edges of corresponding via-holes, and the distances between the lower edges of the wires and the lower edges of corresponding via-holes be larger than 1 micron; for example, the line widths of the output transistor T10 and the output control transistor T9 ranges from 4.0 microns to 4.5 microns; because the output transistor T10 and the output control transistor T9 correspond to a lot via-holes, the line widths of the wires, connecting other transistors, in the third conductive layer 340 are set to enable the line widths of the wires, connecting other transistors, in the third conductive layer 340 to satisfy the requirement of enabling the wires, connecting other transistors, in the third conductive layer 340 to cover corresponding via-holes completely, with a margin of at least 1 micron at the upper and lower of the corresponding via-holes. For example, the width of wires between the via-holes may be smaller.

For example, the distances between wires, such as the first clock signal line ECK, the second clock signal line ECB, the second power line VGH, and the first power line VGL in the third conductive layer 340 are equal to or larger than 3 microns; the line widths of the first clock signal line ECK and the second clock signal line ECB are required to be equal to or larger than 9 microns, to satisfy the driving capability of the first clock signal line ECK and the second clock signal line ECB; the line width of the first power line VGL may be 6 microns, 9 microns or 10 microns; the line width of the second power line VGH is, for example, 10 microns; for example, the first voltage provided by the first power line VGL is generally −7V.

For example, in some examples, the thicknesses of the first conductive layer 320 and the second conductive layer 330 range from 2000 angstroms to 3000 angstroms; the thickness of the third conductive layer 340 ranges from 5000 angstroms to 8000 angstroms, and no limitation will be given in embodiments of the present disclosure in this respect.

For example, through providing the above-mentioned transfer-connection electrodes and the connection wires, problems, which are caused by densely arranged wires, such as the connection and adhesion between wires in same one layer and short circuit of signal lines can be avoided. For example, the above-mentioned transfer-connection electrodes and connection wires are provided for realizing connection or jumper connection function.

The display substrate provided by the above-mentioned embodiments of the present disclosure optimizes connections between wires and the layout of structures in the shift register unit, reduce the amount of wires (for example, a first power line), and reduces the length in the second direction of the shift register unit to a certain extent, and reduce the size of the shift register unit, this is in favor of realizing a design of a display substrate with a narrow bezel while guaranteeing the display quality of the display substrate.

Figure 9:
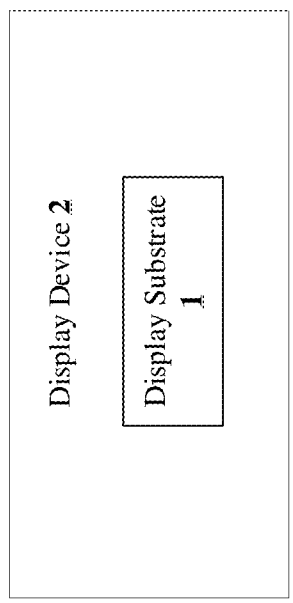
FIG. 9 is a schematic diagram of a display device provided by at least one embodiment of the present disclosure.

At least one embodiment of the present disclosure further provides a display device. FIG. 9 is a schematic diagram of the display device provided by at least one embodiment of the present disclosure. As illustrated in FIG. 9, the display device 2 includes the display substrate 1 provided by any embodiment of the present disclosure; for example, the display substrate 1 as illustrated in FIG. 2.

It should be noted that, the display device 2 may be any product or component with a display function, such as an OLED panel, an OLED TV, a QLED panel, a QLED TV, a mobile phone, a tablet computer, a notebook computer, a digital photo frame, a navigator or the like, and no limitation will be given in embodiments of the present disclosure in this respect.

It should be noted that, for the sake of clarity and simplicity, embodiments of the present disclosure does not illustrate all the components of the display device. In order to realize the basic functions of the display device, those skilled in the art can provide and set other structures that are not shown, according to specific needs, and no limitation will be given in embodiments of the present disclosure in this respect.

Regarding the technical effect of the display device 2 provided by the above embodiments, the technical effect of the display substrate 1 provided in embodiments of the present disclosure can be referred, and no further description will be given here.

Figure 10:
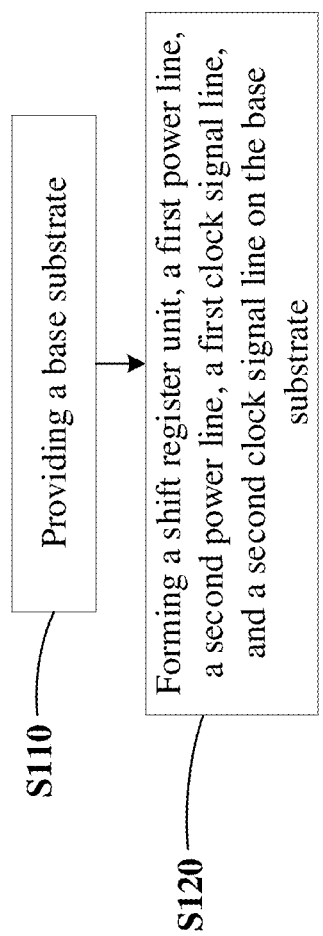
FIG. 10 is a flow chart of a manufacturing method of a display substrate provided by at least one embodiment of the present disclosure.

At least one embodiment of the present disclosure further provides a manufacturing method of the display substrate. FIG. 10 is a flow chart of a manufacturing method of a display substrate provided by at least one embodiment of the present disclosure. For example, the manufacturing method may be used for manufacturing the display substrate provided by any embodiment of the present disclosure. For example, the manufacturing method may be used for manufacturing the display substrate 1 as illustrated in FIG. 2.

As illustrated in FIG. 10, the manufacturing method of the display substrate includes the following step S110 to step S120.

Step S110: providing a base substrate.

Step S120: forming a shift register unit, a first power line, a second power line, a first clock signal line, and a second clock signal line on the base substrate.

For example, forming the semiconductor layer, the first insulation layer, the first conductive layer, the second insulation layer, the second conductive layer, the third insulation layer and the third conductive layer respectively includes: forming a corresponding material layer (for example, a semiconductor material layer, an insulation material layer, or a conductive material layer); in the process of forming each of the above-mentioned layers, a corresponding pattern structure (for example, an active layer, an electrode pattern, a wire, a via, etc.) is formed by using a patterning process. The pattern process is, for example, a photolithography process, which includes: coating a photoresist layer on a material layer to be patterned, performing an exposing process on the photoresist layer with a mask, performing a developing process on the photoresist layer after the exposing process is performed, to obtain a photoresist pattern; and etching a structure layer with the photoresist pattern, and then optionally removing the photoresist pattern.

For step S110, for example, the base substrate 10 may adopt glass, plastic, quartz, or other suitable materials, and no limitation will be given in embodiments of the present disclosure in this respect.

For example, the shift register unit, the first power line, the second power line, the first clock signal line and the second clock signal line are formed on the base substrate.

For step S120, for example, forming the shift register unit 105 includes: sequentially forming the semiconductor layer 310, the first insulation layer 350, the first conductive layer 320, the second insulation layer 360, the second conductive layer 330, the third insulation layer 370, and the third conductive layer 340 in the direction perpendicular to the base substrate 10. Active layers of the transistors are in the semiconductor layer 310; the gate electrodes of the transistors and the first electrodes of the capacitors are in the first conductive layer 320; the second electrodes of the capacitors are in the second conductive layer 330; the first power line VGL, the second power line VGH, the first clock signal line ECK, the second clock signal line ECB, and the first electrodes and the second electrodes of the transistors are in the third conductive layer 340.

For example, through via-holes running through the first insulation layer 350, the second insulation layer 360 or the third insulation layer 370, the transistors and the capacitors are connected to each other, and the transistors and the capacitors are connected to the first power line VGL, the second power line VGH, the first clock signal line ECK, and the second clock signal line ECB.

Regarding the arrangements of the connection structure for connecting the transistors and the capacitors of the shift register unit 105 and the second power line VGH, the first power line VGL, the plurality of clock signal lines, as well as the connection wires and the transfer-connection electrodes, descriptions related to FIG. 2-FIG. 8 can be referred, and no further descriptions will be given here.

It should be noted that, in embodiments of the present disclosure, the processes of the manufacturing method of the display substrate may include more or less operations, these operations may be performed sequentially or in parallel. Although the processes of the manufacturing method described above includes a plurality of operations in a specific order, it should be clearly understood that the order of plurality of operations is not limited. The manufacturing method described above may be executed once, or may be executed several times according to a predetermined setting.

For the technical effect of the manufacturing method of the display substrate provided by the above-mentioned embodiment, the technical effect of the display substrate provided by the embodiment of the present disclosure can be referred, and no further descriptions will be given here.

The following should be noted:

(1) Only the structures involved in the embodiments of the present disclosure are illustrated in the drawings of the embodiments of the present disclosure, and other structures can refer to usual designs.

(2) The embodiments and features in the embodiments of the present disclosure may be combined in case of no conflict to acquire new embodiments.

What have been described above merely are exemplary embodiments of the present disclosure, and not intended to define the scope of the present disclosure, and the scope of the present disclosure is determined by the appended claims.

What is claimed is:

1. A display substrate, comprising:
a base substrate, comprising a display region and a periphery region on at least one side of the display region; and
a shift register unit, a first power line and a second power line, which are on the periphery region of the base substrate,
wherein the first power line is configured to provide a first voltage to the shift register unit, and the second power line is configured to provide a second voltage to the shift register unit;
the shift register unit comprises an input circuit, a first node control circuit, a second node control circuit, a third node control circuit, a fourth node control circuit, and an output control circuit;
the input circuit is configured to input an input signal to a first node in response to a first clock signal;
the second node control circuit is connected to the first power line, and is configured to input the first voltage provided by the first power line or the first clock signal to a second node, under control of the first clock signal and an electrical level of the first node, so as to control an electrical level of the second node;
the first node control circuit is connected to the second power line, and is configured to input the second voltage provided by the second power line to the first node under control of a second clock signal and the electrical level of the second node, so as to perform noise reduction on the first node;
the third node control circuit is configured to control an electrical level of a third node in response to the electrical level of the second node;
the fourth node control circuit is configured to input the electrical level of the third node to a fourth node under control of the second clock signal;
the output control circuit is connected to the second power line and an output terminal, and is configured to output the second voltage which is provided by the second power line and serves as an output signal, to the output terminal under control of an electrical level of the fourth node; and
an orthographic projection of the first power line on the base substrate is on a side of an orthographic projection of the shift register unit on the base substrate closer to the display region, an orthographic projection of the second power line on the base substrate is on a side of the orthographic projection of the shift register unit on the base substrate away from the display region, and the orthographic projection of the shift register unit on the base substrate is between the orthographic projection of the first power line on the base substrate and the orthographic projection of the second power line on the base substrate,
wherein the second node control circuit comprises a first control transistor and a second control transistor;
an active layer of the first control transistor and an active layer of the second control transistor extend along the first direction;
an orthographic projection of the active layer of the first control transistor on the base substrate is on a side of an orthographic projection of the active layer of the second control transistor on the base substrate away from the display region;
the display substrate further comprises a first transfer-connection electrode,
wherein the first transfer-connection electrode comprises a first portion extending along a second direction which is different from the first direction, and a second portion extending along the first direction, and the second portion and the first portion are integratedly formed;
an orthographic projection of the second portion of the first transfer-connection electrode on the base substrate and the orthographic projection of the active layer of the first control transistor on the base substrate are side by side along the second direction, and the orthographic projection of the second portion of the first transfer-connection electrode on the base substrate is at an imaginary line, along the first direction, of the orthographic projection of the active layer of the second control transistor on the base substrate; and
a first electrode of the first control transistor is connected to the first portion of the first transfer-connection electrode, and a first electrode of the second control transistor is connected to the second portion of the first transfer-connection electrode.

2. The display substrate according to claim 1, further comprising:
a first clock signal line and a second clock signal line, which are configured to respectively provide the first clock signal or the second clock signal to the shift register unit,
wherein the first power line, the second power line, the first clock signal line and the second clock signal line are on the base substrate and extend along a first direction; and
the orthographic projection of the second power line on the base substrate is between an orthographic projection of the first clock signal line and the second clock signal line on the base substrate and the orthographic projection of the shift register unit on the base substrate.

3. The display substrate according to claim 1, wherein the input circuit comprises an input transistor,
an active layer of the input transistor extends along the first direction;
an orthographic projection of the active layer of the input transistor on the base substrate is on a side of the orthographic projection of the active layer of the first control transistor on the base substrate away from the display region; and
the orthographic projection of the active layer of the input transistor on the base substrate and the orthographic projection of the active layer of the second control transistor on the base substrate are side by side along the second direction.

4. The display substrate according to claim 3, further comprising a first connection wire extending along the second direction,
wherein the first connection wire comprises a first portion and a second portion;

the first portion of the first connection wire is connected to a gate electrode of the second control transistor and a gate electrode of the input transistor, and the first portion of the first connection wire, as well as the gate electrode of the second control transistor and the gate electrode of the input transistor are integratedly formed;

the second portion of the first connection wire and the gate electrode of the input transistor are connected and integratedly formed; and the second portion of the first connection wire is further connected to the first clock signal line in a layer different from a layer where the second portion of the first connection wire is located.

5. The display substrate according to claim 4, further comprising a second transfer-connection electrode, wherein a second electrode of the first control transistor is connected to the second transfer-connection electrode; and the first portion of the first connection wire is connected to the second transfer-connection electrode through a via-hole running through an insulation layer, so as to connect the second electrode of the first control transistor to the gate electrode of the second control transistor and the gate electrode of the input transistor, which are in a layer different from a layer where the second electrode of the first control transistor is located.

6. The display substrate according to claim 3, wherein the first node control circuit comprises a first noise reduction transistor and a second noise reduction transistor;

an active layer of the first noise reduction transistor and an active layer of the second noise reduction transistor are in a continuous first semiconductor layer, and the first semiconductor layer extends along the first direction;

a gate electrode of the first noise reduction transistor and a gate electrode of the second noise reduction transistor extend along the second direction, and are side by side along the first direction;

the first semiconductor layer is at an imaginary line, extending along the first direction, of the active layer of the input transistor, and is on a side of the active layer of the first control transistor away from the active layer of the input transistor; and the gate electrode of the input transistor, the gate electrode of the first noise reduction transistor, and the gate electrode of the second noise reduction transistor are side by side along the first direction.

7. The display substrate according to claim 6, further comprising a third transfer-connection electrode, wherein the third transfer-connection electrode extends along the first direction;

the first control transistor comprises a first gate electrode and a second gate electrode which are side by side along the first direction;

the first gate electrode and a first end of the second gate electrode are connected to the third transfer-connection electrode through a via-hole running through an insulation layer;

a first electrode of the input transistor is connected to a first end of the third transfer-connection electrode;

a first electrode of the first noise reduction transistor is connected to a second end of the third transfer-connection electrode;

the second power line comprises a first protrusion portion protruding toward the display region in the second direction;

the first protrusion portion overlaps, in a direction perpendicular to the base substrate, with and connects, through a via-hole, to the active layer, in the first semiconductor layer, of the second noise reduction transistor; and a first electrode of the second noise reduction transistor and the first protrusion portion are connected and integratedly formed, so as to enable the first electrode of the second noise reduction transistor to receive the second voltage.

8. The display substrate according to claim 6, wherein the third node control circuit comprises a third control transistor and a first capacitor;

an active layer of the third control transistor extends along the first direction;

the active layer of the third control transistor and the active layer of the second noise reduction transistor are side by side along the second direction;

an orthographic projection of the first capacitor on the base substrate is between an orthographic projection of the active layer of the second noise reduction transistor on the base substrate and an orthographic projection of the active layer of the third control transistor on the base substrate;

the first transfer-connection electrode further comprises a third portion extending along the first direction, and the third portion of the first transfer-connection electrode and the first portion of the first transfer-connection electrode are integratedly formed;

an orthographic projection of the third portion of the first transfer-connection electrode on the base substrate is at an imaginary line, along the first direction, of the orthographic projection of the active layer of the first control transistor on the base substrate;

an end of the third portion of the first transfer-connection electrode is connected to the gate electrode of the second noise reduction transistor, a gate electrode of the third control transistor, and a first electrode of the first capacitor, which are in a layer different form a layer where the third portion of the first transfer-connection electrode is located; and the gate electrode of the second noise reduction transistor, the gate electrode of the third control transistor, and the first electrode of the first capacitor are integratedly formed.

9. The display substrate according to claim 8, wherein the shift register unit further comprises an output circuit;

the output circuit is connected to the first power line and the output terminal, and is configured to reset the output terminal under control of the electrical level of the first node;

the output circuit comprises an output transistor and a second capacitor;

an orthographic projection of an active layer of the output transistor on the base substrate and an orthographic projection of the second capacitor on the base substrate are side by side along the second direction;

the orthographic projection of the second capacitor on the base substrate is between an orthographic projection of the active layer of the first control transistor and the active layer of the second control transistor on the base substrate and the orthographic projection of the active layer of the output transistor on the base substrate;

the orthographic projection of the second capacitor on the base substrate is at an imaginary line, along the first direction, of the orthographic projection of the active layer of the third control transistor on the base substrate;

a first electrode of the second capacitor is connected to second ends of the first gate electrode and the second gate electrode of the first control transistor, and the first electrode of the second capacitor and the second ends of the first gate electrode and the second gate electrode of the first control transistor are integratedly formed;

the first electrode of the second capacitor is further connected to a gate electrode of the output transistor, and the first electrode of the second capacitor and the gate electrode of the output transistor are integratedly formed; and the gate electrode of the output transistor comprises a plurality of sub-gate electrodes which are side by side along the first direction.

10. The display substrate according to claim 9, further comprising a fourth transfer-connection electrode, wherein an orthographic projection of the fourth transfer-connection electrode on the base substrate at least partially overlaps with the orthographic projection of the active layer of the output transistor on the base substrate; and a first end of the fourth transfer-connection electrode and a second electrode of the second control transistor are connected and integratedly formed, a second end of the fourth transfer-connection electrode and a first electrode of the output transistor are connected and integratedly formed, and a third end of the fourth transfer-connection electrode and the first power line are connected and integratedly formed.

11. The display substrate according to claim 9, further comprising a fifth transfer-connection electrode and a second connection wire extending along the second direction, wherein the fifth transfer-connection electrode comprises a first portion extending along the first direction and a second portion extending along the second direction;

a first electrode of the third control transistor and a second end of the first portion of the fifth transfer-connection electrode are connected and integratedly formed;

the gate electrode of the first noise reduction transistor is connected to an end of the second portion of the fifth transfer-connection electrode and the second clock signal line, which are in a layer different form a layer where the gate electrode of the first noise reduction transistor is located;

a second electrode of the second capacitor is connected to a first end, which is in a layer different form a layer where the second electrode of the second capacitor is located, of the first portion of the fifth transfer-connection electrode;

the second connection wire and the gate electrode of the first noise reduction transistor are integratedly formed; and a first end of the second connection wire is connected to the end of the second portion of the fifth transfer-connection electrode through a via-hole running through an insulation layer, and a second end of the second connection wire is connected to the second clock signal line through a via-hole running through the insulation layer.

12. The display substrate according to claim 9, further comprising a fourth node noise reduction circuit, wherein the fourth node noise reduction circuit is connected to the first power line, the first node, and the fourth node, and is configured to perform noise reduction on the fourth node under control of the electrical level of the first node;

the fourth node noise reduction circuit comprises a third noise reduction transistor;

an active layer of the third noise reduction transistor extends along the second direction;

an orthographic projection of the active layer of the third noise reduction transistor on the base substrate and the orthographic projection of the second capacitor on the base substrate are side by side along the first direction, and the orthographic projection of the active layer of the third noise reduction transistor on the base substrate is on a side of the first capacitor closer to the display region, and is on a side of the orthographic projection of the active layer of the third control transistor on the base substrate away from the orthographic projection of the second capacitor on the base substrate;

a gate electrode of the third noise reduction transistor extends along the first direction, and is connected to the first electrode of the second capacitor, the gate electrode of the output transistor, and the first gate electrode and the second gate electrode of the first control transistor; and the gate electrode of the third noise reduction transistor, as well as the first electrode of the second capacitor, the gate electrode of the output transistor, and the gate electrodes of the first control transistor are integratedly formed.

13. The display substrate according to claim 12, wherein the output control circuit comprises an output control transistor and a third capacitor;

an active layer of the output control transistor and the active layer of the output transistor are in a continuous second semiconductor layer, and the second semiconductor layer extends along the first direction;

an orthographic projection of the active layer of the output control transistor on the base substrate and an orthographic projection of the first capacitor and the third capacitor on the base substrate are side by side along the second direction;

the third capacitor is on a side of the first capacitor away from the second capacitor;

the orthographic projection of a second electrode of the third capacitor on the base substrate extends along the second direction;

a first electrode of the third capacitor and a gate electrode of the output control transistor are connected and integratedly formed;

the gate electrode of the output control transistor and the gate electrode of the output transistor are side by side along the first direction;

the gate electrode of the output control transistor comprises a plurality of sub-gate electrodes which are side by side in the first direction;

the second power line further comprises a second protrusion portion protruding toward the display region in the second direction;

the third capacitor overlaps the second power line and the second protrusion portion of the second power line in a direction perpendicular to the base substrate; and the second electrode of the third capacitor is connected to the second power line and the second protrusion portion of the second power line through a via-hole running through an insulation layer.

14. The display substrate according to claim 13, further comprising a seventh transfer-connection electrode, an eighth transfer-connection electrode, a ninth transfer-connection electrode, a tenth transfer-connection electrode and a fourth connection wire,
- wherein the seventh transfer-connection electrode comprises a first portion extending along the second direction and a second portion extending along the first direction;
- a first end of the first portion of the seventh transfer-connection electrode is connected to a second electrode of the fourth control transistor;
- an end of the second portion of the seventh transfer-connection electrode is connected to a first electrode of the third noise reduction transistor;
- a second end of the first portion of the seventh transfer-connection electrode is connected to the first electrode of the third capacitor and the gate electrode of the output control transistor, which are in a layer different from a layer where the second end of the first portion of the seventh transfer-connection electrode is located;
- the eighth transfer-connection electrode is connected to a second electrode of the third noise reduction transistor, a first electrode of the output control transistor, and the second electrode of the third capacitor;
- the ninth transfer-connection electrode is connected to a second electrode of the output control transistor and a second electrode of an input transistor of a shift register unit at a next stage;
- the tenth transfer-connection electrode is connected to a second electrode of the output transistor, and is connected to the fourth connection wire in a layer different from a layer where the tenth transfer-connection electrode is located;
- the fourth connection wire is further connected to the ninth transfer-connection electrode which is in a layer different from a layer where the fourth connection wire is located; and
- the fourth connection wire is connected to at least one gate line, so as to output the output signal at the output terminal to a light-emitting control circuit of a pixel unit at the display region.

15. The display substrate according to claim 6, wherein the fourth node control circuit comprises a fourth control transistor,
- an active layer of the fourth control transistor extends along the first direction, and is on a side of the first semiconductor layer away from the active layer of the input transistor;
- a gate electrode of the fourth control transistor, as well as the gate electrode of the first noise reduction transistor, the gate electrode of the second noise reduction transistor, and the gate electrode of the input transistor are side by side along the first direction;
- the gate electrode of the fourth control transistor is connected to the second clock signal line in a layer different from a layer where the gate electrode of the fourth control transistor is located;
- the display substrate further comprises a sixth transfer-connection electrode,
- wherein the sixth transfer-connection electrode comprises a first portion extending along the second direction, a second portion extending along the first direction and a third portion extending along the second direction;
- the first portion and the third portion of the sixth transfer-connection electrode are parallel to each other, and the first portion and the third portion of the sixth transfer-connection electrode and the second portion of the sixth transfer-connection electrode are integratedly formed;
- an end of the first portion of the sixth transfer-connection electrode is connected to a first electrode of the fourth control transistor;
- the second portion of the sixth transfer-connection electrode is connected to a second electrode, which is in a layer different from a layer where the second portion of the sixth transfer-connection electrode is located, of the first capacitor; and
- an end of the third portion of the sixth transfer-connection electrode is connected to a second electrode of the third control transistor.

16. The display substrate according to claim 15, further comprising a third connection wire extending along the second direction,
- wherein the third connection wire and the gate electrode of the fourth control transistor are integratedly formed; and
- an end of the third connection wire is connected to the second clock signal line through a via-hole running through an insulation layer.

17. The display substrate according to claim 1, further comprising a trigger signal line,
- wherein a plurality of shift register units, that are cascaded, form a gate drive circuit;
- the trigger signal line is configured to provide a trigger signal to the gate drive circuit;
- an orthographic projection of the trigger signal line on the base substrate is on a side of the orthographic projection of the first clock signal line and the second clock signal line on the base substrate away from the display region; and
- the trigger signal line is connected to a second electrode of an input transistor of a first stage of shift register unit in the gate drive circuit, so as to provide the trigger signal.

18. A display device, comprising the display substrate according to claim 1.

* * * * *